United States Patent
Kashiwagura et al.

(10) Patent No.: US 11,596,034 B2
(45) Date of Patent: Feb. 28, 2023

(54) LIGHT-EMITTING MODULE

(71) Applicants: PIONEER CORPORATION, Tokyo (JP); TOHOKU PIONEER CORPORATION, Tendo (JP)

(72) Inventors: Satoshi Kashiwagura, Yonezawa (JP); Shinsuke Tanaka, Yonezawa (JP)

(73) Assignees: Pioneer Corporation, Tokyo (JP); Tohoku Pioneer Corporation, Tendo (JP)

(*) Notice: Subject to any disclaimer, the term of this patent is extended or adjusted under 35 U.S.C. 154(b) by 143 days.

(21) Appl. No.: 17/054,465

(22) PCT Filed: May 27, 2019

(86) PCT No.: PCT/JP2019/020903
§ 371 (c)(1),
(2) Date: Nov. 10, 2020

(87) PCT Pub. No.: WO2019/230652
PCT Pub. Date: Dec. 5, 2019

(65) Prior Publication Data
US 2021/0054989 A1 Feb. 25, 2021

(30) Foreign Application Priority Data

May 30, 2018 (JP) .............................. JP2018-103828
May 30, 2018 (JP) .............................. JP2018-103829
May 30, 2018 (JP) .............................. JP2018-103830

(51) Int. Cl.
*F21V 13/00* (2006.01)
*H05B 44/00* (2022.01)
(Continued)

(52) U.S. Cl.
CPC ............ *H05B 44/00* (2022.01); *F21V 7/0066* (2013.01); *F21V 13/04* (2013.01); *G02F 1/133605* (2013.01); *G02F 1/133606* (2013.01)

(58) Field of Classification Search
CPC . F21V 7/00; F21V 7/0066; F21V 7/04; F21V 13/04; G02F 1/133605; G02F 1/133606
See application file for complete search history.

(56) References Cited

U.S. PATENT DOCUMENTS 8,569,762 B2 10/2013 Ha et al.
10,031,554 B2 7/2018 Yanagisawa
(Continued)

FOREIGN PATENT DOCUMENTS

JP H10050124 A 2/1998
JP 2002-083677 A 3/2002
(Continued)

OTHER PUBLICATIONS

International Search Report for related JP App. No. PCT/JP2019/020903 dated Aug. 20, 2019.
(Continued)

*Primary Examiner* — Y M. Quach Lee
(74) *Attorney, Agent, or Firm* — Procopio, Cory, Hargreaves & Savitch LLP

(57) ABSTRACT

A light-emitting module includes a light-emitting plate including a light-irradiating surface including a plurality of striped-pattern light-emitting units, and a reflecting member including a reflecting surface to reflect light emitted from the light-irradiating surface of the light-emitting plate toward a target surface of an object. Light at a peak luminous intensity in a light distribution in a first region of the light-irradiating surface is sent to a first region of the target surface via a first region of the reflecting surface. Light at a peak luminous intensity in a light distribution in a second region of the (Continued)

light-irradiating surface is sent to a second region of the target surface via a second region of the reflecting surface.

10 Claims, 12 Drawing Sheets

(51) Int. Cl.
*F21V 7/00* (2006.01)
*F21V 13/04* (2006.01)
*G02F 1/13357* (2006.01)

(56) References Cited

U.S. PATENT DOCUMENTS

| | | | |
|---|---|---|---|
| 10,534,401 | B2 | 1/2020 | Yanagisawa |
| 2009/0296383 | A1* | 12/2009 | Valster ..................... F21V 7/04 362/296.01 |
| 2012/0001184 | A1 | 1/2012 | Ha et al. |
| 2013/0235589 | A1* | 9/2013 | Ohno ..................... F21V 13/04 362/296.01 |
| 2014/0362572 | A1* | 12/2014 | Sun ..................... F21V 7/0058 362/245 |
| 2016/0154435 | A1 | 6/2016 | Yanagisawa |
| 2017/0307928 | A1 | 10/2017 | Omata et al. |
| 2018/0307277 | A1 | 10/2018 | Yanagisawa |
| 2019/0113197 | A1 | 4/2019 | Kamiya et al. |

FOREIGN PATENT DOCUMENTS

| | | |
|---|---|---|
| JP | 2007-172945 A | 7/2007 |
| JP | 2016110117 A | 6/2016 |
| JP | 2017044853 A | 3/2017 |
| JP | 2017146529 A | 8/2017 |
| JP | 2012-015092 A | 1/2021 |
| WO | 2016/063870 A1 | 4/2016 |
| WO | 2017164328 A1 | 9/2017 |

OTHER PUBLICATIONS

Office Action received in Japan Patent Application No. 2021-189183, dated Dec. 6, 2022, in 2 pages.

* cited by examiner

LIGHT-EMITTING MODULE

CROSS-REFERENCE TO RELATED APPLICATIONS

This application is a U.S. National Stage entry of PCT Application No. PCt/JP2019/020903, filed on May 27, 2019, which claims priority to JP Application No. 2018-103828, filed May 30, 2018, which claims priority to JP Application No. 2018-103829, tiled May 30, 2018, which claims priority to JP Application No. 2018-103830, filed May 30, 2018. The contents of the foregoing are incorporated by reference.

TECHNICAL FIELD

The present invention relates to a light-emitting module.

BACKGROUND ART

In recent years, displays having Liquid Crystal On Silicon (LCOS) have been developed. Such displays can be used for head-up displays (HUD), head-mount displays (HMD), electronic view finders (EVF), or projectors.

Patent Document 1 describes one example of a display having LCOS. In this display, light emitted from a light source is reflected toward the LCOS by a polarizing beam splitter (PBS). The PBS reflects S polarization of the light emitted from the light source toward the LCOS. One region of the LCOS returns this S polarization toward the PBS while the polarization direction of the S polarization reflected from the PBS is kept unchanged. Another one region of the LCOS converts the S polarization reflected from the PBS into P polarization and returns the P polarization toward the PBS. The S polarization returned toward the PBS does not pass through the PBS while the polarization returned toward the PBS passes through the PBS. A desired image can be displayed by controlling the above-mentioned one region and the other one region of the LCOS by a circuit inside the LCOS.

Patent Document 2 describes a display device having an organic light-emitting diode (OLED). This display device includes a light guide plate and a reflective liquid crystal display (LCD) element. The light guide plate includes a first surface having irregularities formed thereon and an end face. The light guide plate is overlapped with the reflective LCD element so that the first surface thereof faces the reflective LCD element. Light emitted from the OLED enters the end face of the light guide plate, is emitted from the irregularities of the first surface of the light guide plate, and enters the reflective LCD element.

RELATED ART DOCUMENT

Patent Document

[Patent Document 1]: Japanese Unexamined Patent Application Publication No. 2017-146529
[Patent Document 2]: Japanese Unexamined Patent Application Publication No. Hei 10-50124

SUMMARY OF THE INVENTION

In various light-emitting modules (for example, a reflective LCD or a head-up display (HUD)), light emitted from a light-irradiating surface of a light-emitting plate may be reflected toward a target surface of an object by a reflecting surface of a reflecting member. The present inventors found out that variation in the brightness distribution of the target surface can be generated depending on the condition of an optical system of a light-emitting module.

An example of the problem to be solved by the present invention is to inhibit variation in a brightness distribution of a target surface.

Means for Solving the Problem

The invention described in claim 1 is a light-emitting module including:

a light-emitting plate having a light-irradiating surface; and a reflecting member having a reflecting surface to reflect light emitted from the light-irradiating surface of the light-emitting plate toward a target surface of an object, in which light at a peak luminous intensity in a light distribution in a first region of the light-irradiating surface is sent to a first region of the target surface via a first region of the reflecting surface, in which light at a peak luminous intensity in a light distribution in a second region of the light-irradiating surface is sent to a second region of the target surface via a second region of the reflecting surface, in which an optical distance from the first region of the light-irradiating surface to the first region of the target surface via the first region of the reflecting surface is greater than an optical distance from the second region of the light-irradiating surface to the second region of the target surface via the second region of the reflecting surface, and in which the peak luminous intensity in the light distribution of the first region of the light-irradiating surface is higher than the peak luminous intensity in the light distribution of the second region of the light-irradiating surface.

The invention described in claim 5 is a light-emitting module including:

a light-emitting plate having a light-irradiating surface; and a reflecting member having a reflecting surface to reflect light emitted from the light-irradiating surface of the light-emitting plate toward a target surface of an object, in which light at a peak luminous intensity in a light distribution in a first region of the light-irradiating surface is sent to a first region of the target surface via a first region of the reflecting surface, in which light at a peak luminous intensity in a light distribution in a second region of the light-irradiating surface is sent to a second region of the target surface via a second region of the reflecting surface, in which the peak luminous intensity in the light distribution of the first region of the light-irradiating surface is substantially equal to the peak luminous intensity in the light distribution of the second region of the light-irradiating surface, in which a normal direction in the first region of the reflecting surface is different from a normal direction in the second region of the reflecting surface, and in which an optical distance from the first region of the light-irradiating surface to the first region of the target surface via the first region of the reflecting surface is substantially equal to an optical distance from the second region of the light-irradiating surface to the second region of the target surface via the second region of the reflecting surface.

BRIEF DESCRIPTION OF THE DRAWINGS

The objects described above, and other objects, features and advantages are further made apparent by suitable embodiments that will be described below and the following accompanying diagrams.

DESCRIPTION OF EMBODIMENT

Figure 1:
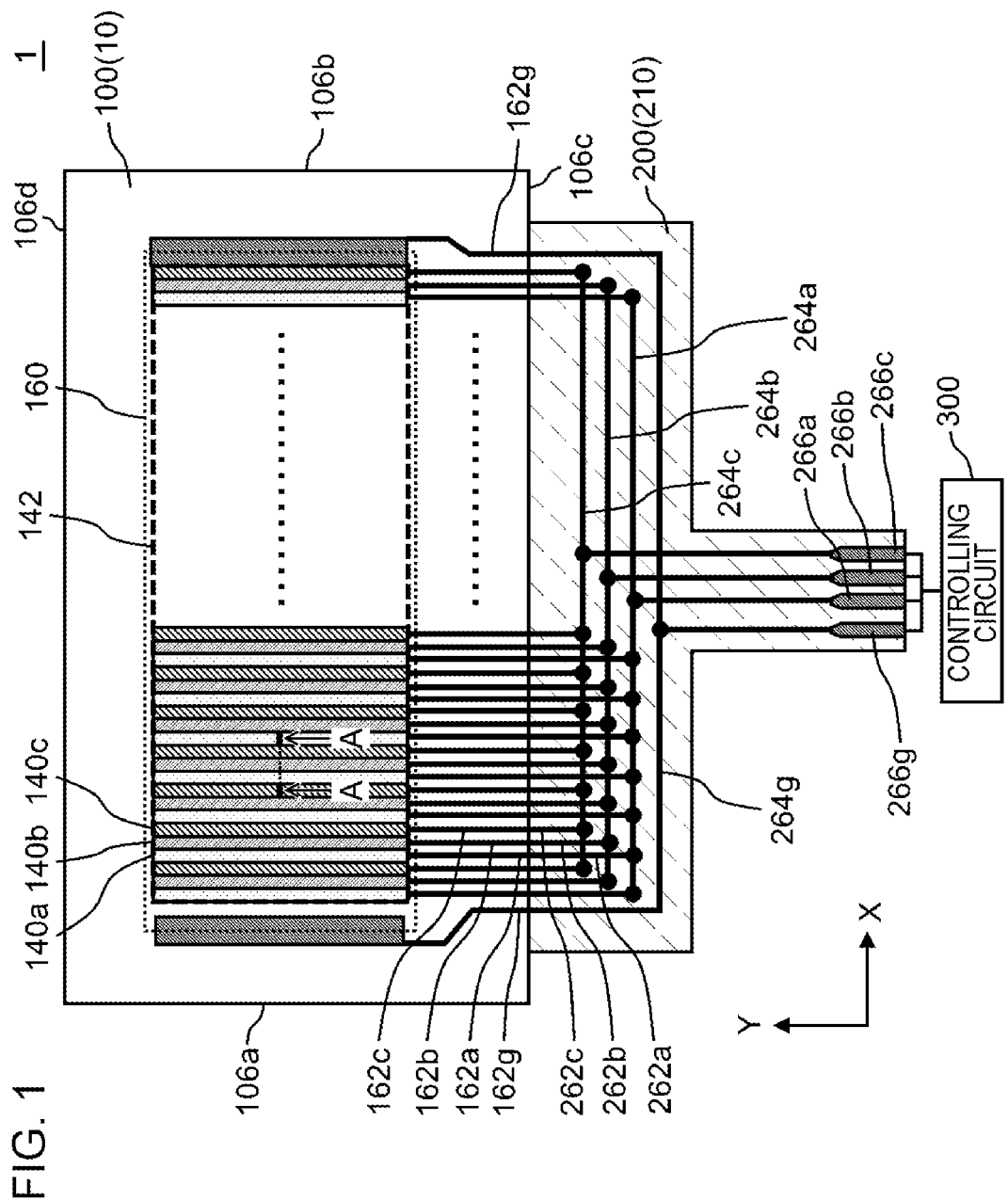
FIG. 1 is a plan view of a light-emitting device according to an embodiment.

An embodiment of the present invention will be described below by referring to the drawings. Moreover, in all the drawings, the same constituent elements are given the same reference numerals, and descriptions thereof will not be repeated.

Figure 2:
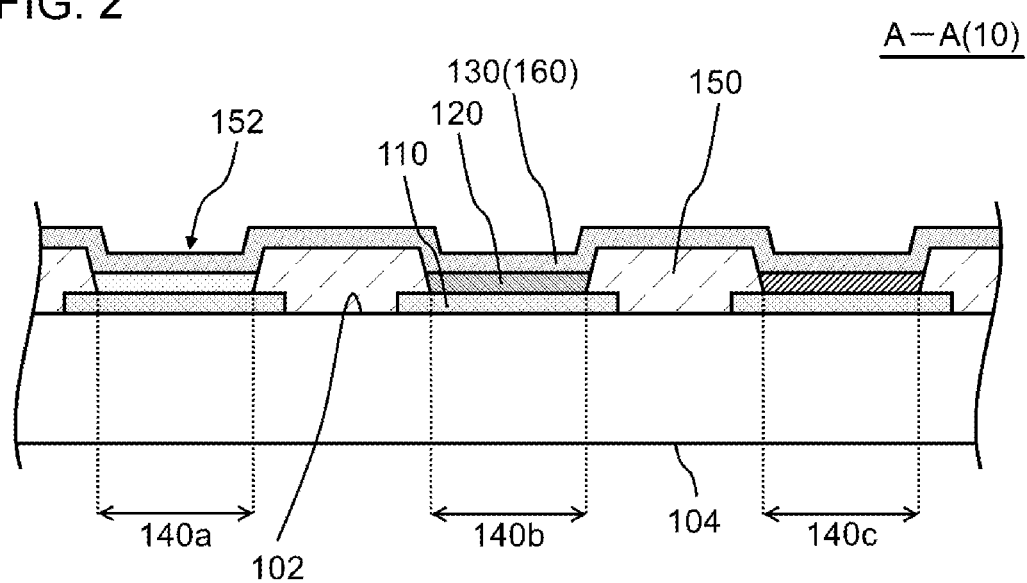
FIG. 2 is a cross-sectional view taken along line A-A of FIG. 1.

FIG. 1 is a plan view of a light-emitting device 1 according to an embodiment. FIG. 2 is a cross-sectional view taken along line A-A of FIG. 1.

A summary of the light-emitting device 1 is explained using FIG. 1. The light-emitting device 1 includes a plurality of first light-emitting units 140a, a plurality of second light-emitting units 140b, a plurality of third light-emitting units 140c, and a controlling circuit 300. Each of the plurality of first light-emitting units 140a includes an organic EL (organic electroluminescence) element which emits light of a first color, specifically, an organic material which emits light of the first color. Each of the plurality of second light-emitting units 140b includes an organic EL element emitting light of a second color which is different from the first color, specifically, an organic material which emits light of the second color. The plurality of second light-emitting units 140b are adjacent to the plurality of first light-emitting units 140a, respectively. Each of the plurality of third light-emitting units 140c includes an organic EL element emitting light of a third color which is different from any of the first color and the second color, specifically, an organic material which emits light of the third color. Each of the plurality of third light-emitting units 140c is adjacent to each of the plurality of first light-emitting units 140a and each of the plurality of second light-emitting units 140b. The controlling circuit 300 allows the plurality of first light-emitting units 140a to emit light while inhibiting the plurality of second light-emitting units 140b and the plurality of third light-emitting units 140c from emitting light at a first timing. The controlling circuit 300 allows the plurality of second light-emitting units 140b to emit light while inhibiting the plurality of first light-emitting units 140a and the plurality of third light-emitting units 140c from emitting light at a second timing. The controlling circuit 300 allows the plurality of third light-emitting units 140c to emit light while inhibiting the plurality of first light-emitting units 140a and the plurality of second light-emitting units 140b from emitting light at a third timing. In one example, the controlling circuit 300 may repeat light emission by the plurality of first light-emitting units 140a, light emission by the plurality of second light-emitting units 140b, and light emission by the plurality of third light-emitting units 140c.

The light-emitting device 1 can function as a light source of a field sequential color (FSC) display (for example, an FSC liquid crystal display (LCD)). Specifically, the light-emitting device 1 can function as a surface light source which emits light of a first color by light emission of the plurality of first light-emitting units 140a at the first timing, can function as a surface light source which emits light of a second color by light emission of the plurality of second light-emitting units 140b at the second timing, and can function as a surface light source which emits light of a third color by light emission of the plurality of third light-emitting units 140c at the third timing. By an element to selectively project light in one region, for example, an LCD element (for example, a reflective LCD element (for example, Liquid Crystal On Silicon (LCOS))) or a light-transmitting-type LCD element), a first image can be generated from light of the first color, a second image can be generated from light of the second color, and a third image can be generated from light of the third color, thereby generating a color image by synthesizing the first image, the second image, and the third image. Thus, the light-emitting device 1 can function as a light source of an FSC display.

In the example shown in FIG. 1, the light-emitting device 1 emits lights of three colors, that is, light of a first color, light of a second color, and light of a third color. In one example, the first color may be red (R), the second color may be green (G), and the third color may be blue (B). In another example, the light-emitting device 1 may emit lights of only two colors, for example, light of the first color and light of the second color only. Further in another example, the light-emitting device 1 may emit lights of more than three colors (for example, four colors).

Details of a plan layout of the light-emitting device 1 is explained using FIG. 1.

The light-emitting device 1 includes a light-emitting plate 10, a wiring substrate 200, and the controlling circuit 300.

The light-emitting plate 10 includes a substrate 100, the plurality of first light-emitting units 140a, the plurality of second light-emitting units 140b, the plurality of third light-emitting units 140c, an electrode 160, a plurality of first interconnects 162a, a plurality of second interconnects 162b, a plurality of third interconnects 162c, and two interconnects 162g.

The wiring substrate 200 includes a base 210, a plurality of first interconnects 262a, a plurality of second interconnects 262b, a plurality of third interconnects 262c, a first wiring 264a, a second wiring 264b, a third wiring 264c, a wiring 264g, a first terminal 266a, a second terminal 266b, a third terminal 266c, and a terminal 266g.

The substrate 100 has a substantially rectangular shape. The substrate 100 includes a first side 106a, a second side 106b, a third side 106c, and a fourth side 106d. The first side 106a extends in one direction (Y direction in FIG. 1). The second side 106b is on the opposite side of the first side 106a. The third side 106c is between the first side 106a and the second side 106b and extends in a direction intersecting the first side 106a (X direction in FIG. 1). The fourth side 106d is on the opposite side of the third side 106c. Each of the third side 106c and the fourth side 106d is longer than each of the first side 106a and the second side 106b, In another example, the substrate 100 may have a shape which is different from a rectangle.

The plurality of first light-emitting units 140a, the plurality of second light-emitting units 140b, and the plurality of third light-emitting units 140c configure a light-emitting region 142. The plurality of first light-emitting units 140a, the plurality of second light-emitting units 140b, and the plurality of third light-emitting units 140c are arranged in a striped pattern. Specifically, the plurality of first light-emitting units 140a, the plurality of second light-emitting units 140b, and the plurality of third light-emitting units 140c extend in one direction (Y direction in FIG. 1) and are aligned together along a direction intersecting the one direction (X direction in FIG. 1). The light-emitting region 142 is longer in the arrangement direction (X direction in FIG. 1) of each light-emitting unit than the extending direction (Y direction in FIG. 1) of each light-emitting unit.

In the example shown in FIG. 1, the plurality of first light-emitting units 140a, the plurality of second light-emitting units 140b, and the plurality of third light-emitting units 140c are aligned in regular order, that is, the first light-emitting unit 140a, the second light-emitting unit 140b, and the third light-emitting unit 140c are repeatedly aligned in this order. In another example, the plurality of first light-emitting units 140a, the plurality of second light-emitting units 140b, and the plurality of third light-emitting units 140c may be at least partly aligned in irregular order.

The electrode 160 is shared by the plurality of first light-emitting units 140a, the plurality of second light-emitting units 140b, and the plurality of third light-emitting units 140c, and extends across the plurality of first light-emitting units 140a, the plurality of second light-emitting units 140b, and the plurality of third light-emitting units 140c. Voltage applied to the electrode 160 can be applied to all of the plurality of first light-emitting units 140a, the plurality of second light-emitting units 140b, and the plurality of third light-emitting units 140c.

The plurality of first interconnects 162a are connected to the plurality of first light-emitting units 140a, respectively, the plurality of second interconnects 162b are connected to the plurality of second light-emitting units 140b, respectively, and the plurality of third interconnects 162c are connected to the plurality of third light-emitting units 140c, respectively. One out of the two interconnects 162g is connected to one end of the electrode 160, and the other of the two interconnects 162g is connected to the other end of the electrode 160. The one end of the electrode 160 and the other end thereof are located opposing each other in the arrangement direction (X direction in FIG. 1) of the plurality of first light-emitting units 140a, the plurality of second light-emitting units 140b, and the plurality of third light-emitting units 140c. Voltage can be applied to both ends of the electrode 160 by the two interconnects 162g. Therefore, it is possible to inhibit variation in the voltage distribution of the electrode 160.

The wiring substrate 200 is disposed along the third side 106c of the substrate 100. The plurality of first interconnects 262a of the wiring substrate 200 are connected to the plurality of first interconnects 162a of the substrate 100, respectively, the plurality of second interconnects 262b of the wiring substrate 200 are connected to the plurality of second interconnects 162b of the substrate 100, respectively, and the plurality of third interconnects 262c of the wiring substrate 200 are connected to the plurality of third interconnects 162c of the substrate 100, respectively.

The first wiring 264a of the wiring substrate 200 is connected to the plurality of first interconnects 262a, the second wiring 264b of the wiring substrate 200 is connected to the plurality of second interconnects 262b, and the third wiring 264c of the wiring substrate 200 is connected to the plurality of third interconnects 262c. One end of the wiring 264g of the wiring substrate 200 is connected to one interconnect 162g, and the other end of the wiring 264g of the wiring substrate 200 is connected to the other interconnect 162g.

The first terminal 266a of the wiring substrate 200 is connected to the first wiring 264a, the second terminal 266b of the wiring substrate 200 is connected to the second wiring 264b, the third terminal 266c of the wiring substrate 200 is connected to the third wiring 264c, and the terminal 266g of the wiring substrate 200 is connected to the wiring 264g.

The controlling circuit 300 can apply voltage to the first terminal 266a to allow the plurality of first light-emitting units 140a to emit light at the first timing, can apply voltage to the second terminal 266b to allow the plurality of second light-emitting units 140b to emit light at the second timing, and can apply voltage to the third terminal 266c to allow the plurality of third light-emitting units 140c to emit light at the third timing. The controlling circuit 300 can apply a reference potential (for example, ground potential) for the above-mentioned voltage to the terminal 266g at any of the first timing, the second timing, and the third timing.

According to the configuration described above, a plurality of light-emitting units can be easily controlled. Specifically, according to the configuration described above, by applying voltage to the first terminal 266a, the second terminal 266b, or the third terminal 266c, any of the plurality of first light-emitting units 140a, the plurality of second light-emitting units 140b, and the plurality of third light-emitting units 140c can be selectively made to emit light. Therefore, an element (for example, a thin film transistor (TFT)) to control each light-emitting unit need not be provided in each light-emitting unit. Thus, the plurality of light-emitting units can be easily controlled.

Details of a cross-sectional structure of the light-emitting device 1 is explained using FIG. 2.

The substrate 100 includes a first surface 102 and a second surface 104. A first electrode 110, an organic layer 120, a second electrode 130, and an insulating layer 150 are located over the first surface 102 of the substrate 100. The second surface 104 is on the opposite side of the first surface 102.

The insulating layer 150 includes an opening 152. The opening 152 of the insulating layer 150 defines the first light-emitting unit 140a, the second light-emitting unit 140b, and the third light-emitting unit 140c. In the opening 152 of the insulating layer 150, the first electrode 110, the organic layer 120, and the second electrode 130 are laminated to constitute the first light-emitting unit 140a, the second light-emitting unit 140b, and the third light-emitting units 140c. As such, the plurality of first light-emitting units 140a, the plurality of second light-emitting units 140b, and the plurality of third light-emitting units 140c are located over the first surface 102 of the substrate 100 and are repeatedly aligned together along the first surface 102 of the substrate 100.

The substrate 100 is formed of, for example, glass or a resin. The substrate 100 may or may not have flexibility. The substrate 100 may or may not have light-transmitting properties.

The first electrode 110 functions as an anode. The first electrode 110 may or may not have light-transmitting properties.

The organic layer 120 includes an emission layer (EML) which can emit light by organic electro luminescence (EL). An EML of the first light-emitting unit 140a, an EML of the second light-emitting unit 140b, and an EHL of the third light-emitting unit 140c include organic materials which are different from each other. Therefore, the first light-emitting unit 140a, the second light-emitting unit 140b, and the third light-emitting unit 140c can emit light of colors which are different from each other. The organic layer 120 may appropriately include a hole injection layer (HIL), a hole transport layer (HTL), an electron transport layer (ETL), and an electron injection layer (EIL). The organic layer 120 may further include a charge generating layer (CGL).

The second electrode 130 functions as a cathode. The second electrode 130 may or may not have light-transmitting properties.

In one example, the first electrode 110 may have light-transmitting properties, and the second electrode 130 may have light shielding properties, specifically, light reflectivity. In this example, light emitted from the organic layer 120 is transmitted through the first electrode 110 and the substrate 100 and emitted from the second surface 104 of the substrate 100. In another example, the first electrode 110 may have light shielding properties, and the second electrode 130 may have light-transmitting properties. In this example, light emitted from the organic layer 120 is transmitted through the second electrode 130 and emitted from a side opposite to the second surface 104 of the substrate 100.

Further in another example, both of the first electrode 110 and the second electrode 130 way have light-transmitting properties. In this example, a portion of light emitted from the organic layer 120 is transmitted through the first electrode 110 and the substrate 100 and emitted from the second surface 104 of the substrate 100, and another portion of the light emitted from the organic layer 120 is transmitted through the second electrode 130 and emitted from a side opposite to the second surface 104 of the substrate 100.

In one example, in a case where the first electrode 110 includes a light-transmitting conductive material, the first electrode 110 can have light-transmitting properties. The light-transmitting conductive material is, for example, a metal oxide (for example, an indium tin oxide (ITO), an indium zinc oxide (IZO), an indium tungsten zinc oxide (IWZO), a zinc oxide (ZnO)) or an indium gallium zinc oxide (IGZO), a carbon nanotube, or an electroconductive polymer (for example, PEDOT). In another example, in a case where the first electrode 110 is formed of a metal thin film (for example, Ag) or an alloy thin film (for example, AgMg), the first electrode 110 can have light-transmitting properties. The same also applies to the second electrode 130.

In one example, in a case where the first electrode 110 includes a light shielding conductive material, particularly, a light-reflective conductive material, the first electrode 110 can have light shielding properties, particularly, light reflectivity. In one example, the light shielding conductive material is a metal or an alloy, more specifically, at least one metal selected from a group consisting of Al, Au, Ag, Pt, Mg, Sn, Zn, and In, or an alloy of metals selected from this group. The same also applies to the second electrode 130.

In a case where the first electrode 110 has low conductivity, for: example, in a case where the first electrode 110 includes a light-transmitting conductive material, the light-emitting plate 10 may include a conductive layer (not shown in the drawing) which functions as an auxiliary electrode of the first electrode 110. The conductive layer may be covered by the first electrode 110 or covered by the insulating layer 150 on the first electrode 110. The conductive layer is, for example, MAM(Mo/Al/Mo).

The first electrode 110 of the first, light-emitting unit 140a, the first electrode 110 of the second light-emitting unit 140b, and the first electrode 110 of the third light-emitting unit 140c are separated from each other. The organic layer 120 of the first light-emitting unit 140a, the organic layer 120 of the second light-emitting unit 140b, and the organic layer 120 of the third light-emitting unit 140c are separated from each other, and include emission layers (EML) which are different from each other. The second electrode 130 is shared by the first light-emitting unit 140a, the second light-emitting unit 140b, and the third light-emitting unit 140c, and covers the first electrode 110 of the first light-emitting unit 140a, the first electrode 110 of the second light-emitting unit 140b, the first electrode 110 of the third light-emitting unit 140c, and the insulating layer 150.

The first electrode 110 of the first light-emitting unit 140a is connected to the first interconnect 162a shown in FIG. 1, the first electrode 110 of the second light-emitting unit 140b is connected to the second interconnect 162b shown in FIG. 1, and the first electrode 110 of the third light-emitting unit 140c is connected to the third interconnect 162c shown in FIG. 1. The second electrode 130 is the electrode 160 shown in FIG. 1, and is connected to the two interconnects 162g shown in FIG. 1.

In one example, the first electrode 110 of each light-emitting unit may be integrally formed with an interconnect (first interconnect 162a, second interconnect 162b, or third interconnect 162c). In this example, a conductive pattern is located over the first surface 102 of the substrate 100, and one region of this conductive pattern functions as the first electrode 110, and another region of this conductive pattern functions as an interconnect.

Figure 3:
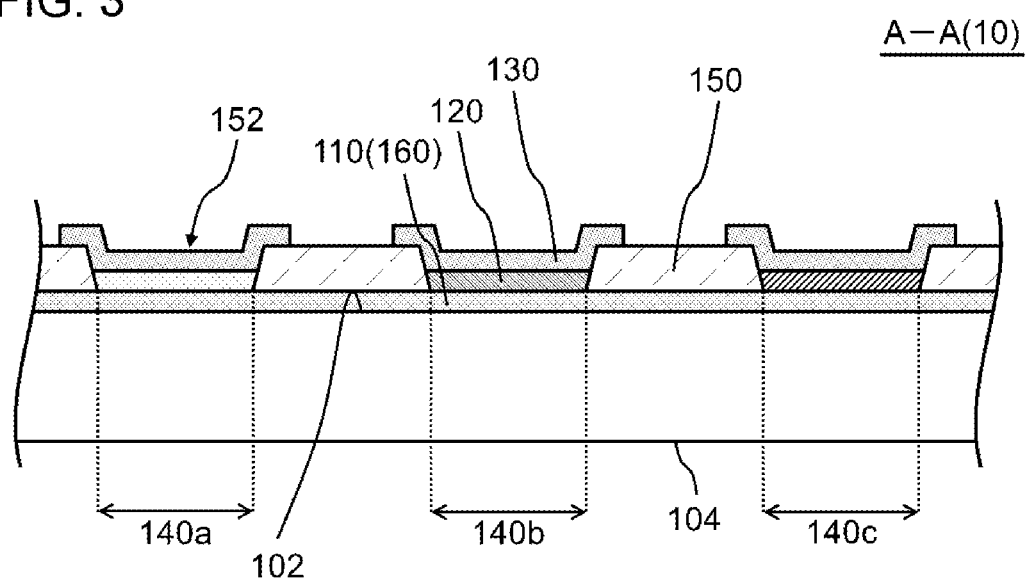
FIG. 3 is a diagram of a modification example of FIG. 2.

FIG. 3 is a diagram showing a modification example of FIG. 2. The example shown in FIG. 3 is the same as the example shown in FIG. 2 except the following.

The first electrode 110 is shared by the first light-emitting unit 140a, the second light-emitting unit 140b, and the third light-emitting unit 140c. The organic layer 120 and the second electrode 130 are located over the first electrode 110.

The second electrode 130 of the first light-emitting unit 140a, the second electrode 130 of the second light-emitting unit 140b, the second electrode 130 of the third light-emitting unit 140c are separated from each other. In the example shown in the diagram, an example of separately coloring the second electrode 130 using a metal mask is described without being limited thereto. In another example, the second electrode 130 may be divided by forming partition walls between the first light-emitting unit 140a, the second light-emitting unit 140b, and the third light-emitting unit 140c.

The first electrode 110 is the electrode 160 shown in FIG. 1, and is connected to the two interconnects 162g shown in FIG. 1. The second electrode 130 of the first light-emitting unit 140a is connected to the first interconnect 162a shown in FIG. 1, the second electrode 130 of the second light-emitting unit 140b is connected to the second interconnect 162b shown in FIG. 1, and the second electrode 130 of the third light-emitting unit 140c is connected to the third interconnect 162c shown in FIG. 1.

Figure 4:
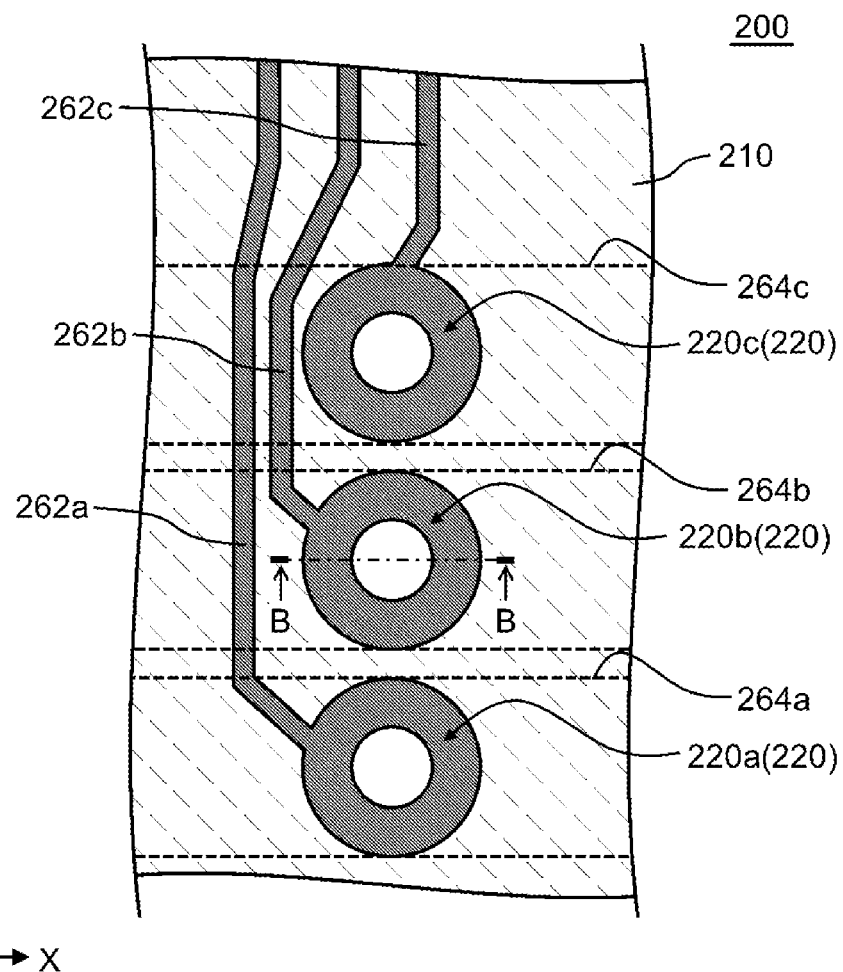
FIG. 4 is an enlarged plan view of a portion of a wiring substrate shown in FIG. 1.
Figure 5:
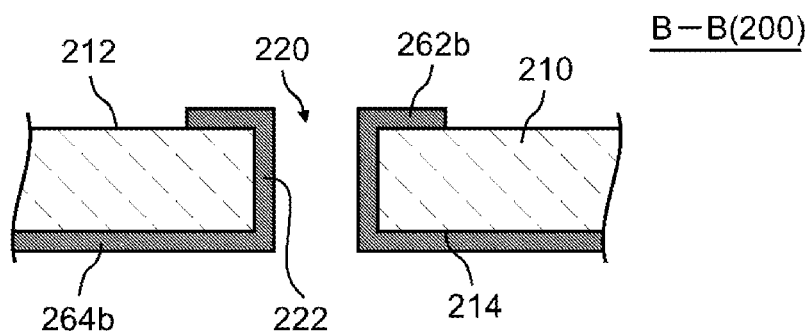
FIG. 5 is a cross-sectional view taken along line B-B of FIG. 4.

FIG. 4 is an enlarged plan view of a portion of the wiring substrate 200 shown in FIG. 1. FIG. 5 is a cross-sectional view taken along line B-B of FIG. 4.

One example of the details of the wiring substrate 200 is explained using FIGS. 4 and 5.

In the examples shown in FIGS. 4 and 5, the wiring substrate 200 is a flexible printed circuit (FPC). Therefore, the wiring substrate 200 can be deformed with a high degree of freedom.

The wiring substrate 200 includes the base 210. The base 210 has electrical insulation properties. The base 210 includes a first surface 212 and a second surface 214. The second surface 214 is on the opposite side of the first surface 212. The base 210 includes a through hole 220. The through hole 220 penetrates the base 210 from the first surface 212 to the second surface 214.

As shown in FIG. 5, the second interconnect 262b is located over the first surface 212 of the base 210, and the second wiring 264b is located over the second surface 214 of the base 210. The second interconnect 262b and the second wiring 264b are connected to each other through a conductive layer 222 formed on a side face of the through hole 220. The first interconnect 262a and the first wiring 264a are connected to each other as is the case with the second interconnect 262b and the second wiring 264b, and the third interconnect 262c and the third wiring 264c are connected to each Other as is the case with the second interconnect 262b and the second wiring 264b.

As shown in FIG. 4, the through hole 220 (first through hole 220a) to reciprocally connect the first interconnect 262a to the first wiring 264a, the through hole 220 (second through hole 220b) to reciprocally connect the second interconnect 262b to the second wiring 264b, and the through hole 220 (third through hole 220c) to reciprocally connect the third interconnect 262c to the third wiring 264c are aligned in a row along the Y direction in FIG. 4. Therefore, a set of the first through hole 220a, the second through hole 220b, and the third through hole 220c can be arranged in a small space along the X direction in FIG. 4.

The second interconnect 262b includes a portion bypassing the third through hole 220c and extending. Therefore, it is possible to prevent the second interconnect 262b from interfering with the third through hole 220c. Similarly, the first interconnect 262a includes a portion bypassing the third through hole 220c and the second through hole 220b and extending. Therefore, it is possible to prevent the first interconnect 262a from interfering with the third through hole 220c and the second through hole 220b.

The base 210 separates the first interconnect 262a and the second wiring 264b from each other in an overlapping region of the first interconnect 262a and the second wiring 264b and separates the first interconnect 262a and the third wiring 264c from each other in an overlapping region of the first interconnect 262a and the third wiring 264c. Therefore, interconnection between the first interconnect 262a and the second wiring 264b and interconnection between the first interconnect. 262a and the third wiring 264c can be prevented. Similarly, the base 210 separates the second interconnect 262b and the third wiring 264c from each other in an overlapping region of the second interconnect 262b and the third wiring 264c. Therefore, interconnection between the second interconnect 262b and the third wiring 264c can be prevented.

Figure 6:
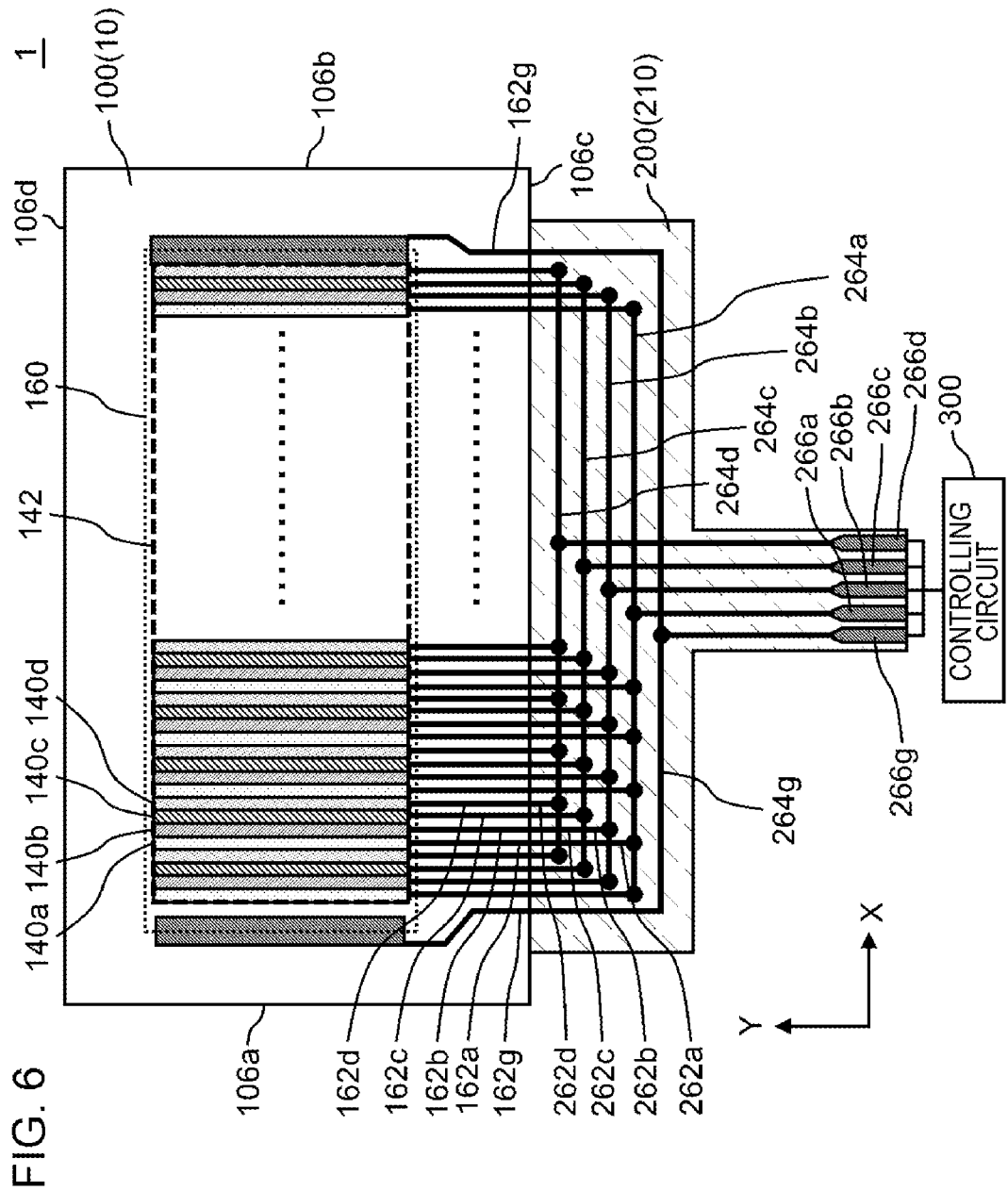
FIG. 6 is a diagram showing a first modification example of FIG. 1.

FIG. 6 is a diagram showing a first modification example of FIG. 1. The example shown in FIG. 6 is the same as the example shown in FIG. 1 except the following.

The light-emitting device 1 includes a plurality of fourth light-emitting units 140d. Each of the plurality of fourth light-emitting units 140d includes an organic EL element emitting light of a fourth color which is different from any of the first color, the second color, and the third color, and specifically, include an organic material which emits light of the fourth color. The plurality of fourth light-emitting units 140d are aligned along the first surface 102 of the substrate 100 (FIG. 2 or FIG. 3) together with the plurality of first light-emitting units 140a, the plurality of second light-emitting units 140b, and the plurality of third light-emitting units 140c. The controlling circuit 300 inhibits the plurality of fourth light-emitting units 140d from emitting light at the first timing, the second timing, and the third timing. The controlling circuit 300 allows the plurality of fourth light-emitting units 140d to emit light at a fourth timing while inhibiting light emission from the plurality of first light-emitting units 140a, the plurality of second light-emitting units 140b, and the plurality of third light-emitting units 140c. In one example, the controlling circuit 300 may repeat light emission by the plurality of first light-emitting units 140a, light emission by the plurality of second light-emitting units 140b, light emission by the plurality of third light-emitting units 140c, and light emission by the plurality of light-emitting units 140d.

According to the configuration described above, the light-emitting device 1 can function as a surface light source which emits light of the first color by light emission of the plurality of first light-emitting units 140a at the first timing, can function as a surface light source which emits light of the second color by light emission of the plurality of second light-emitting units 140b at the second timing, can function as a surface light source which emits light of the third color by light emission of the plurality of third light-emitting units 140c at the third timing, and can function as a surface light source which emits light of the fourth color by light emission of the plurality of fourth light-emitting units 140d at the fourth timing. Thus, the light-emitting device 1 can function as the light source of an FSC display. In one example, the first color may be red (R), the second color may be green (G), the third color may be blue (B), and the fourth color may be yellow (Y). In another example, the first color may be red (R), the second color may be green (G), the third color may be blue (B), and the fourth color may be white (W).

In the example shown in FIG. 6, the plurality of first light-emitting units 140a, the plurality of second light-emitting units 140b, the plurality of third light-emitting units 140c, and the plurality of fourth light-emitting units 140d are aligned in regular order, that is, the first light-emitting unit 140a, the second light-emitting unit 140b, the third light-emitting unit 140c, and the fourth light-emitting unit 140d are repeatedly aligned in this order. In another example, the first light-emitting unit 140a, the second light-emitting unit 140b, the third light-emitting unit 140c, and the fourth light-emitting unit 140d may be at least partly aligned in irregular order.

The light-emitting device 1 includes a plurality of fourth interconnects 162d. The plurality of fourth interconnects 162d are connected to the plurality of fourth light-emitting units 140d, respectively.

The wiring substrate 200 includes a plurality of fourth interconnects 262d, a fourth wiring 264d, and the fourth terminal 266d. The plurality of fourth interconnects 262d of the wiring substrate 200 are connected to the plurality of fourth interconnects 162d of the substrate 100, respectively. The fourth wiring 264d is connected to the plurality of fourth interconnects 262d. The fourth terminal 266d is connected to the fourth wiring 264d. The controlling circuit 300 can apply voltage, to the fourth terminal 266d at the fourth timing, to allow the plurality of the fourth light-emitting units 140d to emit light.

The plurality of first light-emitting units 140a, the plurality of second light-emitting units 140b, the plurality of third light-emitting units 140c, and the plurality of fourth light-emitting units 140d may include, as shown in FIG. 2, a plurality of first electrodes 110 which are separated from each other and may share a second electrode 130 (electrode 160). Alternatively, as shown in FIG. 3, the plurality of first light-emitting units 140a, the plurality of second light-emitting units 140b, the plurality of third light-emitting units 140c, and the plurality of fourth light-emitting units 140d may include a plurality of second electrodes 130 which are separated from each other and may share a first electrode 110 (electrode 160).

Figure 7:
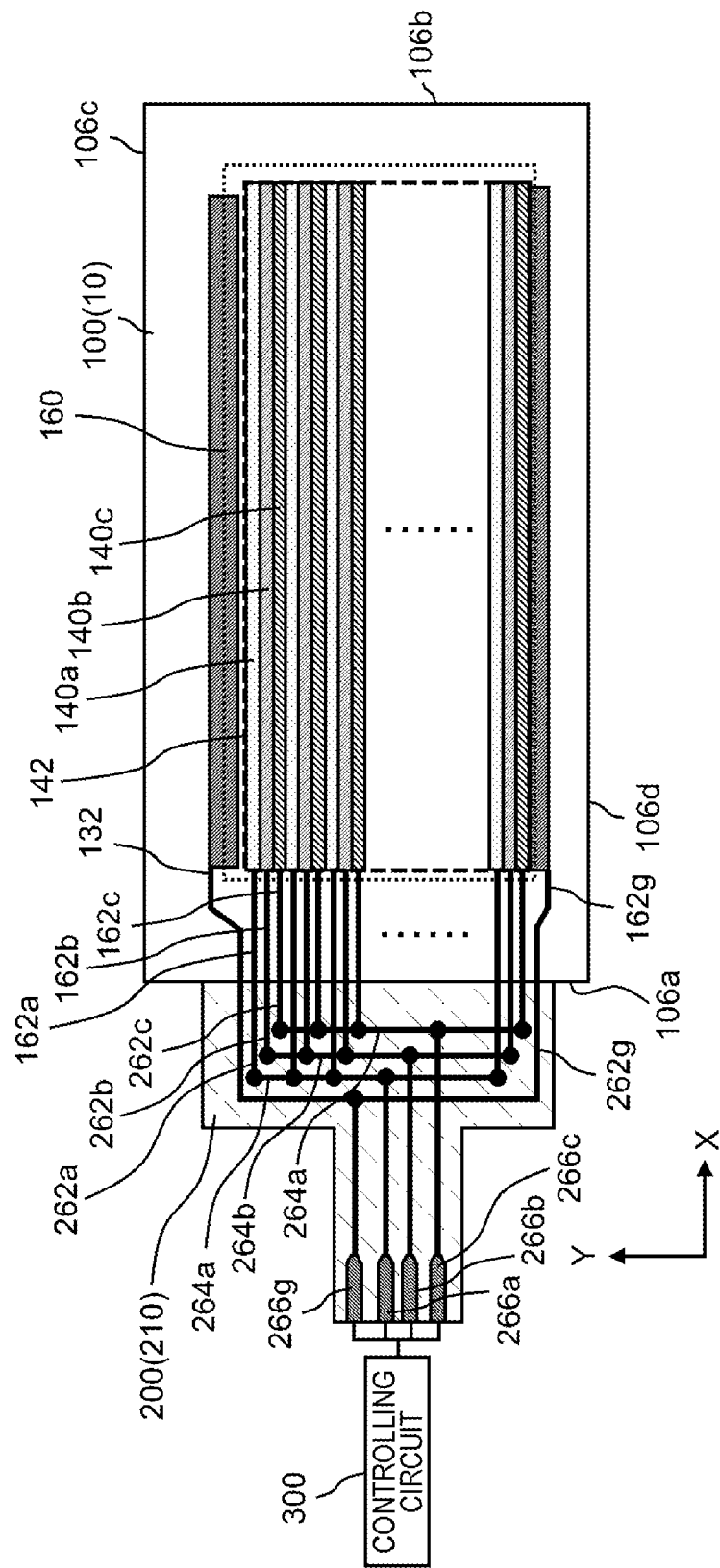
FIG. 7 is a diagram showing a second modification example of FIG. 1.

FIG. 7 is a diagram showing a second modification example of FIG. 1. The example shown in FIG. 7 is the same as the example shown in FIG. 1 except the following.

The plurality of first light-emitting units 140a, the plurality of second light-emitting units 140b, and the plurality of third light-emitting units 140c configure the light-emitting region 142. The plurality of first light-emitting units 140a, the plurality of second light-emitting units 140b, and the plurality of third light-emitting units 140c are arranged in a striped pattern. Specifically, the plurality of first light-emitting units 140a, the plurality of second light-emitting units 140b, and the plurality of third light-emitting units 140c extend in one direction (X direction in FIG. 7), and are repeatedly aligned together along a direction (Y direction in FIG. 7) intersecting the one direction. The light-emitting region 142 is longer than the arrangement direction of each light-emitting unit (Y direction in FIG. 7) in the extending direction of each light-emitting unit (X direction in FIG. 7).

One interconnect 162g is connected to one end of the electrode 160, and the other interconnect 162g is connected to the other end of the electrode 160. The one end and the other end of the electrode 160 are located opposing each other in the arrangement direction (Y direction in FIG. 7) of the plurality of first light-emitting units 140a, the plurality of second light-emitting units 140b, and the plurality of third light-emitting units 140c.

The wiring substrate 200 is disposed along the first side 106a of the substrate 100.

The plurality of first light-emitting units 140a, the plurality of second light-emitting units 140b, and the plurality of third light-emitting units 140c may include, as shown in FIG. 2, a plurality of first electrodes 110 which are separated from each other and may share a second electrode 130 (electrode 160). Alternatively, as shown in FIG. 3, the plurality of first light-emitting units 140a, the plurality of second light-emitting units 140b, and the plurality of third light-emitting units 140c may include a plurality of second electrodes 130 which are separated from each other and may share a first electrode 110 (electrode 160).

Figure 8:
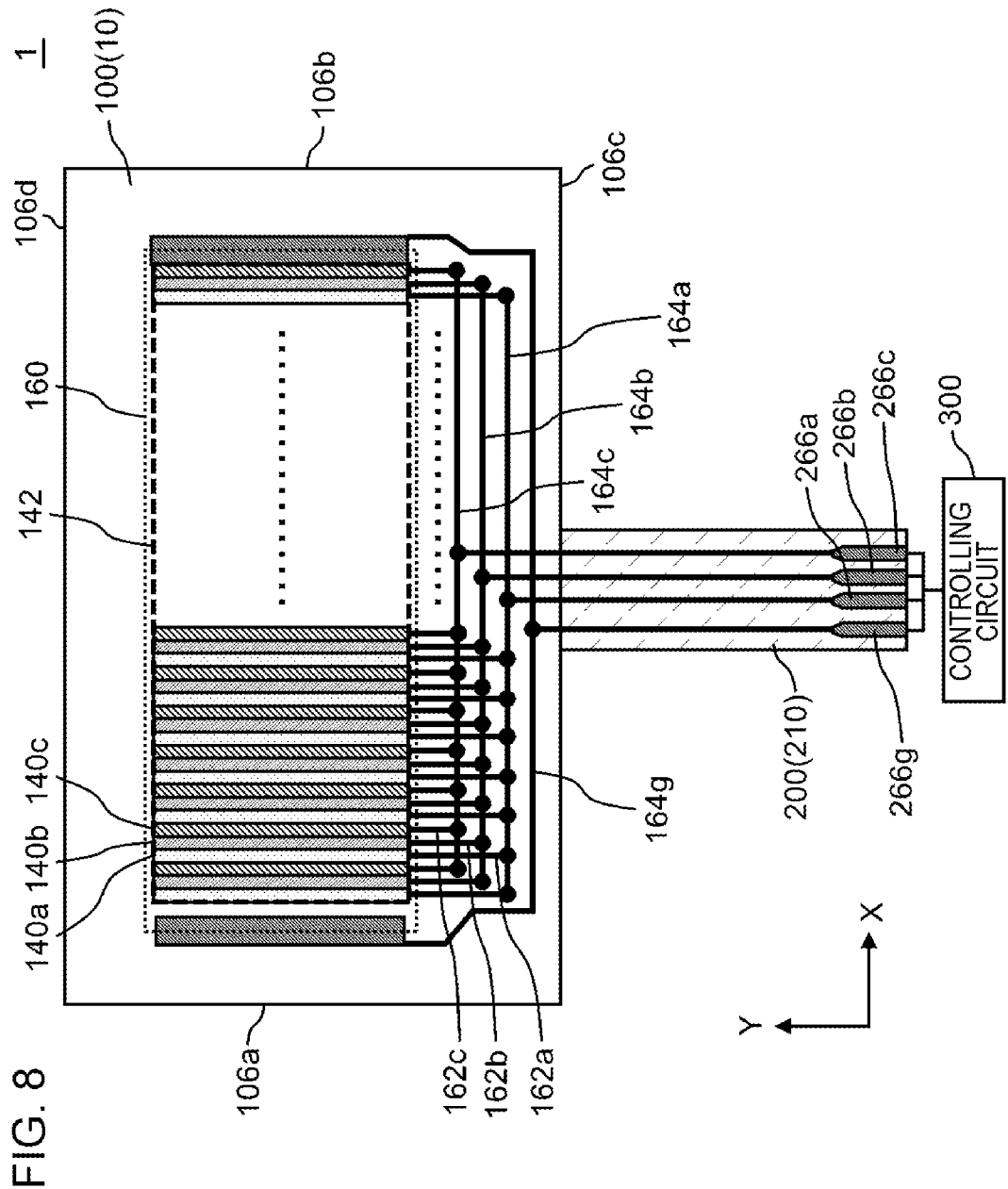
FIG. 8 is a diagram showing a third modification example of FIG. 1.
Figure 9:
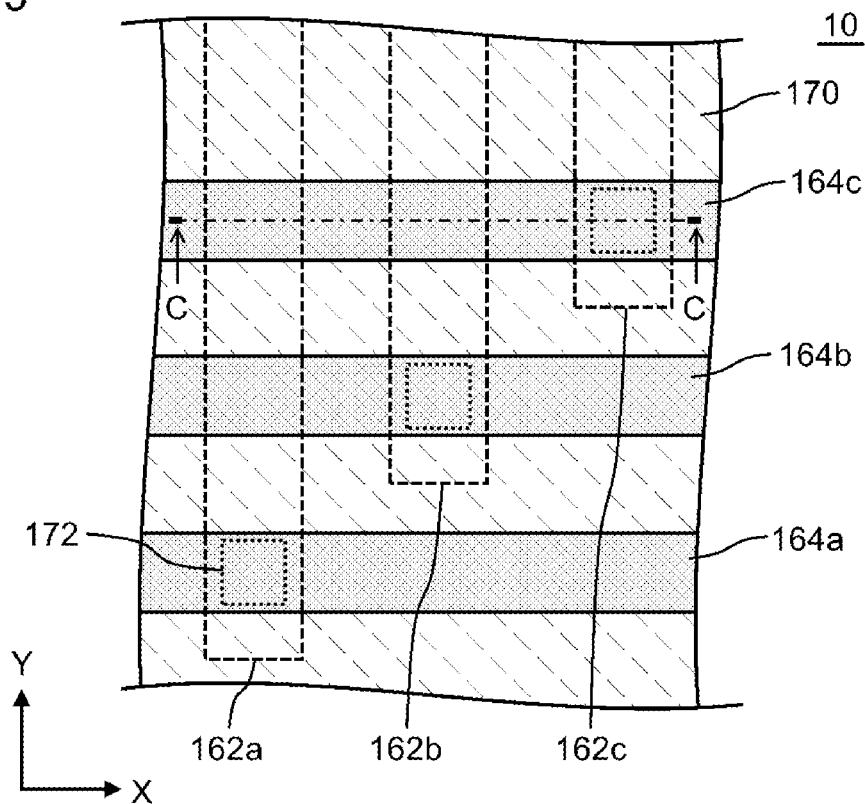
FIG. 9 is an enlarged plan view of a portion of the substrate shown in FIG. 8.
Figure 10:
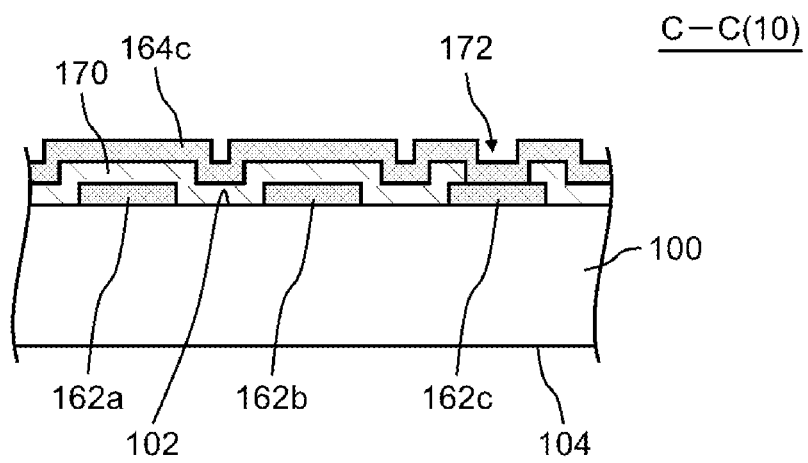
FIG. 10 is a cross-sectional view taken along line C-C of FIG. 9.

FIG. 8 is a diagram showing a third modification example of FIG. 1. FIG. 9 is an enlarged plan view of a portion of the substrate 100 shown in FIG. 8. FIG. 10 is a cross-sectional view taken along line C-C of FIG. 9. The examples shown in FIGS. 8, 9, and 10 are the same as the example shown in FIG. 1 except the following.

A summary of the light-emitting device 1 will be explained using FIGS. 8-10. The light-emitting device 1 includes the plurality of first interconnects 162a, the plurality of second interconnects 162b, and the plurality of third interconnects 162c. The plurality of first interconnects 162a, the plurality of second interconnects 162b, and the plurality of third interconnects 162c are aligned together. The light-emitting device 1 includes a first wiring 164a, a second wiring 164b, and a third wiring 164c. As shown in FIG. 10, the first interconnect 162a, the second interconnect 162b, the third interconnect 162c, the first wiring 164a, the second wiring 164b, arid the third wiring 164c are located over the first surface 102 of the substrate 100. The first wiring 164a is connected to the plurality of first interconnects 162a. The second wiring 164b is connected to the plurality of second interconnects 162b. The third wiring 164c is connected to the plurality of third interconnects 162c.

According to the configuration described above, a plurality of interconnects which are connected to the plurality of light-emitting units, respectively, can be arranged at a narrow pitch. Specifically, in the configuration described above, a wiring (for example, the first wiring 164a) to reciprocally connect the plurality of interconnects (for example, the plurality of first interconnects 162a) which are connected to the plurality of light-emitting units (for example, the plurality of first light-emitting units 140a), respectively, can be provided over the first surface 102 of the substrate 100. Therefore, the plurality of interconnects need not be extracted to the outside of the substrate 100 (for example, the wiring substrate 200). At the outside of the substrate 100 (for example, the wiring substrate 200), there may be a case where it is difficult to arrange the plurality of interconnects (for example, the plurality of first interconnects 262a shown in FIG. 1) at a narrow pitch. In contrast to this, the plurality of interconnects can be arranged over the first surface 102 of the substrate 100 at a narrow pitch by using a fine processing technology (for example, patterning by lithography or patterning by vapor deposition using a mask) to form each light-emitting unit. In this way, the plurality of interconnects which are connected to the plurality of light-emitting units, respectively, can be arranged at a narrow pitch.

In the examples shown in FIGS. 6-10, the light-emitting device 1 includes three groups of light-emitting units, that is, the plurality of first light-emitting units 140a, the plurality of second light-emitting units 140b, and the plurality of third light-emitting units 140c. However, in another example, the light-emitting device 1 may include only two groups of light-emitting units, for example, the plurality of first light-emitting units 140a and the plurality of third light-emitting units 140c. Alternatively, the light-emitting device 1 may have at least one group of light-emitting units and one light-emitting unit. Even in a case where the light-emitting device 1 includes only one group of light-emitting units and only two groups of light-emitting units, as described above, the plurality of interconnects which are connected to the plurality of light-emitting units, respectively, can be arranged at a narrow pitch.

In the examples shown in FIGS. 8-10, the first color of the plurality of first light-emitting units 140a, the second color of the plurality of second light-emitting units 140b, and the third color of the plurality of third light-emitting units 140c are different from each other, and are, for example, red (R), green (G), and blue (B), respectively. However, in another example, at least two of the first color of the plurality of first light-emitting units 140a, the second color of the plurality of second light-emitting units 140b, and the third color of the plurality of third light-emitting units 140c may be the same color. For example, both of the plurality of first light-emitting units 140a and the plurality of second light-emitting units 140b may emit light of the first color.

In the examples shown in FIGS. 8-10, the plurality of first interconnects 162a, the plurality of second interconnects 162b, and the plurality of third interconnects 162c are aligned in regular order, that is, the first interconnect 162a, the second interconnect 162b, and the third interconnect 162c are repeatedly aligned in this order. In another example, the plurality of first interconnects 162a, the plurality of second interconnects 162b, and the plurality of third interconnects 162c may be at least partly aligned in irregular order.

Details of the light-emitting device 1 will be explained using FIG. 8.

The plurality of first light-emitting units 140a, the plurality of second light-emitting units 140b, and the plurality of third light-emitting units 140c may include, as shown in FIG. 2, the plurality of first electrodes 110 which are separated from each other. In this case, each of the first interconnect 162a, the second interconnect 162b, and the third interconnect 162c may be formed integrally with the first electrode 110. In this case, the plurality of first interconnects 162a, the plurality of second interconnects 162b, the plurality of third interconnects 162c, and the plurality of first electrodes 110 can be formed simultaneously by, for example, patterning of the conductive layer.

The plurality of first light-emitting units 140a, the plurality of second light-emitting units 140b, and the plurality of third light-emitting units 140c may include, as shown in FIG. 3, the plurality of second electrodes 130 which are separated from each other. In this case, each of the first interconnect 162a, the second interconnect 162b, and the third interconnect 162c may be formed integrally with the second electrode 130. In this case, the plurality of first interconnects 162a, the plurality of second interconnects 162b, the plurality of third interconnects 162c, and the plurality of second electrodes 130 may be formed simultaneously by, for example, vapor deposition using a mask.

As is the case with the first wiring 164a, the second wiring 164b, and the third wiring 164c, a wiring 164g is provided on the substrate 100. An end of the wiring 164g is connected to an end of the electrode 160, and the other end of the wiring 164g is connected to the other end of the electrode 160.

The first terminal 266a of the wiring substrate 200 is connected to the first wiring 164a of the substrate 100, the second terminal 266b of the wiring substrate 200 is connected to the second wiring 164b of the substrate 100, the third terminal 266c of the wiring substrate 200 is connected to the third wiring 164c of the substrate 100, and the terminal 266g of the wiring substrate 200 is connected to the wiring 164g of the substrate 100.

Details of the light-emitting device 1 will be explained using FIGS. 9 and 10.

The light-emitting device 1 includes an insulating layer 170. The insulating layer 170 is located over the first surface 102 of the substrate 100, and covers at least a portion of the first interconnect 162a, at least a portion of the second interconnect 162b, and at least a portion of the third interconnect 162c. The insulating layer 170 may be integrally formed with the insulating layer 150 shown in FIGS. 2 and 3.

The first wiring 164a, the second wiring 164b, and the third wiring 164c are located over the insulating layer 170. The first wiring 164a extends in a direction intersecting the first interconnect 162a (X direction in FIG. 9), and overlaps one region of the first interconnect 162a. The second wiring 164b extends in a direction intersecting the second interconnect 162b (X direction in FIG. 9), and overlaps one region of the first interconnect 162a and one region of the second interconnect 162b. The third wiring 164c extends in a direction intersecting the third interconnect 162c (X direction in FIG. 9), and overlaps one region of the first interconnect 162a, one region of the second interconnect 162b, and one region of the third interconnect 162c.

The insulating layer 170 includes an opening 172 to reciprocally connect the first wiring 164a to the first interconnect 162a in an overlapping region of the first wiring 164a and the first interconnect 162a. Therefore, it is possible to implement interconnection between the first wiring 164a and the first interconnect 162a.

The insulating layer 170 includes an opening 172 to reciprocally connect the second wiring 164b to the second interconnect 162b in an overlapping region of the second wiring 164b and the second interconnect 162b, and separates the second wiring 164b and the first interconnect 162a from each other in the overlapping region of the second wiring 164b and the first interconnect 162a. Therefore, it is possible to implement interconnection between the second wiring 164b and the second interconnect 162b and prevent interconnection between the second wiring 164b and the first interconnect 162a.

The insulating layer 170 includes an opening 172 to reciprocally connect the third wiring 164c to the third interconnect 162c in an overlapping region of the third wiring 164c and the third interconnect 162c, separates the third wiring 164c and the second interconnect 162b from each other in an overlapping region of the third wiring 164c and the second interconnect 162b, and separates the third wiring 164c and the first interconnect 162a from each other in an overlapping region of the third wiring 164c and the first interconnect 162a. Therefore, it is possible to implement interconnection between the third wiring 164c and the third interconnect 162c and prevent interconnection between the third wiring 164c and the second interconnect 162b and interconnection between the third wiring 164c and the first interconnect 162a.

Figure 11:
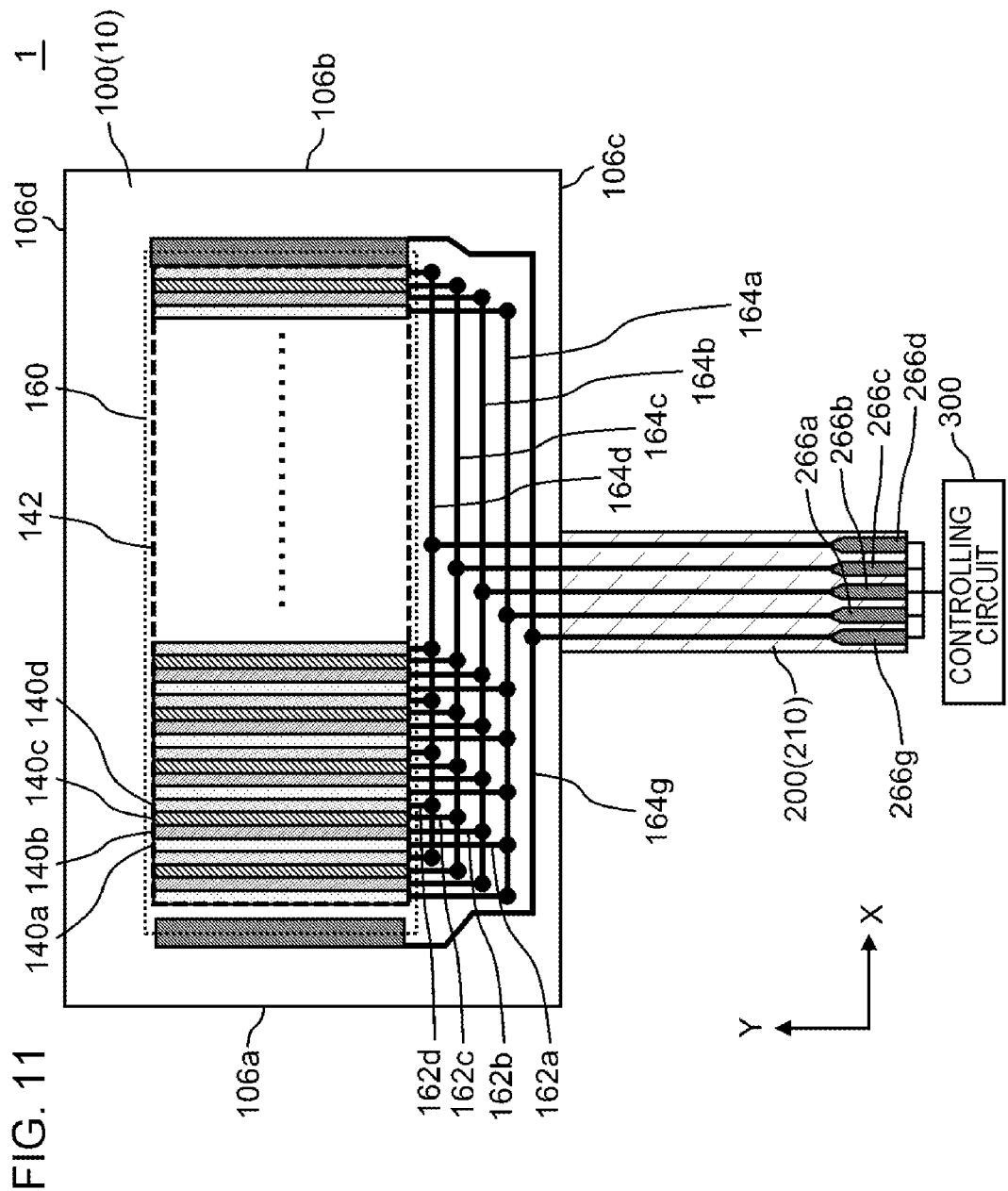
FIG. 11 is a diagram showing a fourth modification example of FIG. 1.

FIG. 11 is a diagram showing a fourth modification example of FIG. 4. The example shown in FIG. 11 is the same as the example shown in FIG. 8 except the following.

The light-emitting device 1 includes the plurality of fourth light-emitting units 140d, the plurality of fourth interconnects 162d, and a fourth wiring 164d. As is the case with the plurality of first light-emitting units 140a, the plurality of second light-emitting units 140b, and the plurality of third light-emitting units 140c, the plurality of fourth light-emitting units 140*d* are located over the first surface 102 (FIG. 2 or FIG. 3) of the substrate 100. The plurality of fourth interconnects 162*d* are connected to the plurality of fourth light-emitting units 140*d*, respectively. The plurality of fourth interconnects 162*d* are aligned together with the plurality of first interconnects 162*a*, the plurality of second interconnects 182*b*, and the plurality of third interconnects 162*c*. As is the case with the first interconnect 162*a*, the second interconnect 162*b*, the third interconnect 162*c*, the first wiring 164*a*, the second wiring 164*b*, and the third wiring 264*c*, the fourth interconnect 162*d* and the fourth wiring 164*d* are located over the first surface 102 (FIG. 10) of the substrate 100. The fourth wiring 164*d* is connected to the plurality of fourth interconnects 162*d*. The fourth terminal 266*d* of the wiring substrate 200 is connected to the fourth wiring 164*d* of the substrate 100.

In one example, the first color of the plurality of first light-emitting units 140*a*, the second color of the plurality of second light-emitting units 140*b*, the third color of the plurality of third light-emitting units 140*c*, and a fourth color of the plurality of fourth light-emitting units 140*d* may be red (R), green (G), blue (B), and yellow (Y), respectively. In another example, the first color of the plurality of first light-emitting units 140*a*, the second color of the plurality of second light-emitting units 140*b*, the third color of the plurality of third light-emitting units 140*c*, and the fourth color of the plurality of fourth light-emitting units 140*d* may be red (R), green (G), blue (B), and white (W), respectively.

Figure 12:
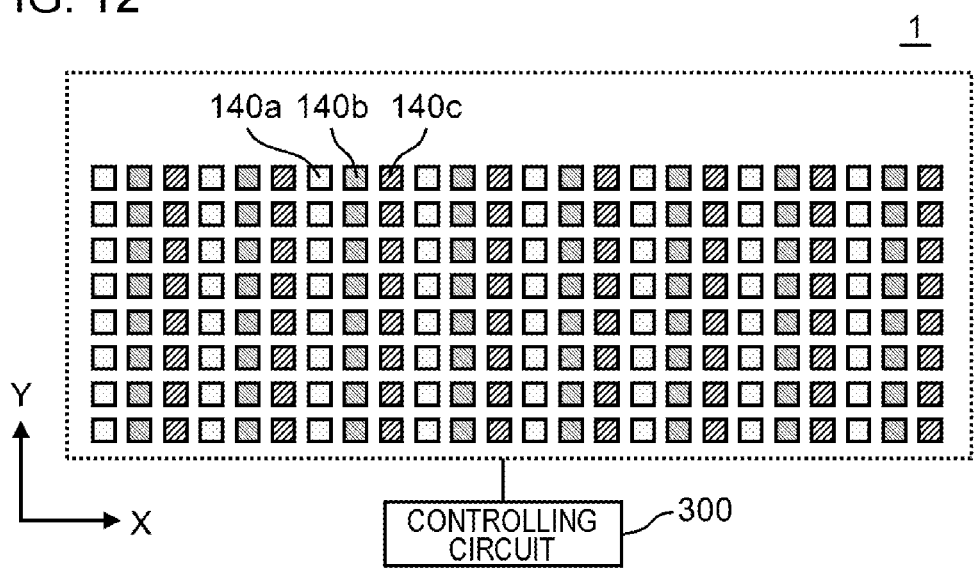
FIG. 12 is a diagram to explain a first modification example of a layout of a plurality of first light-emitting units, a plurality of second light-emitting units, and a plurality of third light-emitting units.

In the example shown in FIG. 12, the plurality of first interconnects 162*a*, the plurality of second interconnects 162*b*, the plurality of third interconnects 162*c*, and the plurality of fourth interconnects 262*d* are repeatedly aligned in regular order, that is, in an order of the first interconnect 162*a*, the second interconnect 162*b*, the third interconnect 162*c*, and the fourth interconnect 162*a*. In another example, the plurality of first interconnects 162*a*, the plurality of second interconnects 162*b*, the plurality of third interconnects 162*c*, and the plurality of fourth interconnects 162*d* may be at least partly aligned in irregular order.

In the example shown in FIG. 11 also, the plurality of interconnects which are connected to the plurality of light-emitting units, respectively, can be arranged at a narrow pitch.

FIG. 12 is a diagram to explain a first modification example of a layout of the plurality of first light-emitting units 140*a*, the plurality of second light-emitting units 140*b*, and the plurality of third light-emitting units 140*c*.

The plurality of first light-emitting units 140*a*, the plurality of second light-emitting units 140*b*, and the plurality of third light-emitting units 140*c* may be arranged in a dot matrix.

Figure 13:
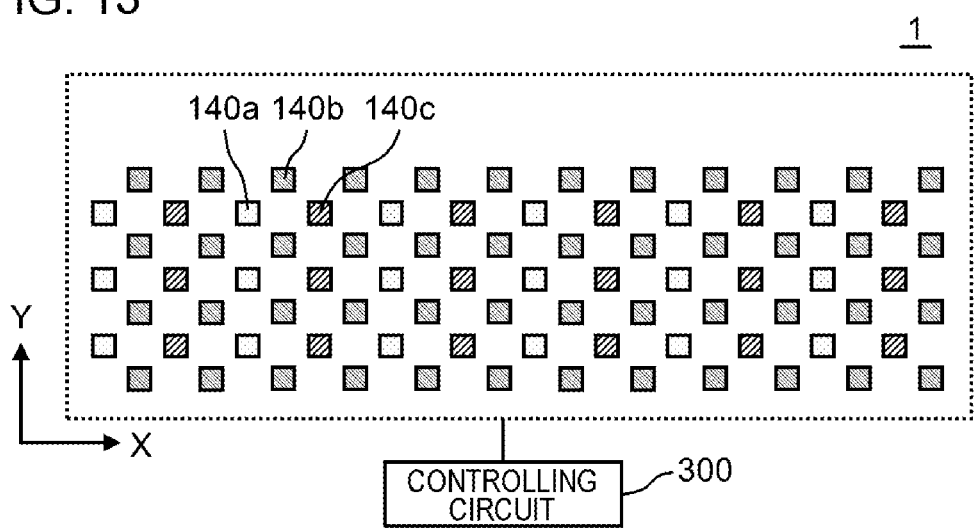
FIG. 13 is a diagram to explain a second modification example of a layout of a plurality of first light-emitting units, a plurality of second light-emitting units, and a plurality of third light-emitting units.

FIG. 13 is a diagram to explain a second modification example of a layout of the plurality of first light-emitting units 140*a*, the plurality of second light-emitting units 140*b*, and the plurality of third light-emitting units 140*c*.

The plurality of first light-emitting units 140*a*, the plurality of second light-emitting units 140*b*, and the plurality of third light-emitting units 140*c* may be arranged in a pen tile matrix.

Figure 14:
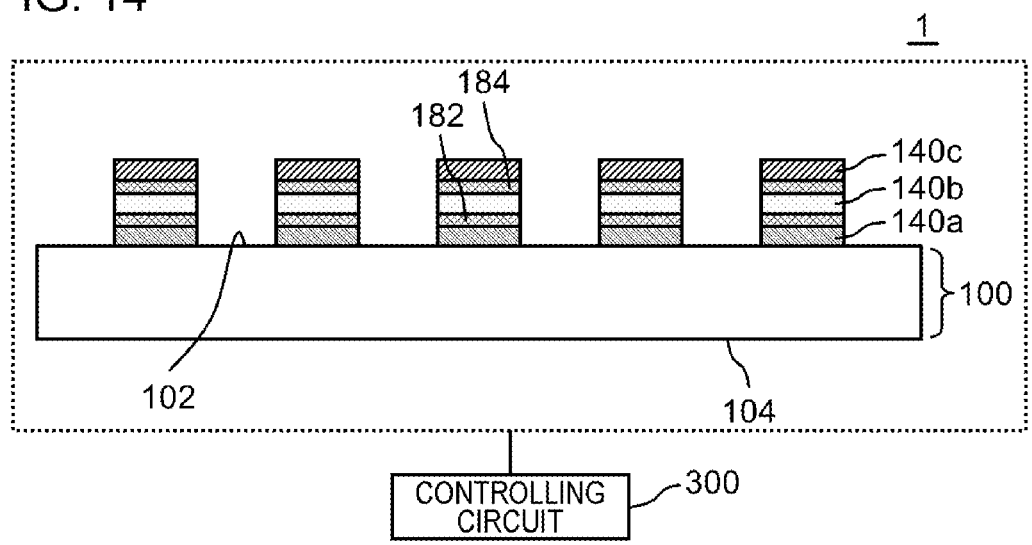
FIG. 14 is a diagram to explain a third modification example of a layout of a plurality of first light-emitting units, a plurality of second light-emitting units, and a plurality of third light-emitting units.

FIG. 14 is a diagram to explain a third modification example of a layout of the plurality of first light-emitting units 140*a*, the plurality of second light-emitting units 140*b*, and the plurality of third light-emitting units 140*c*.

Each of the plurality of second light-emitting units 140*b* is stacked on each of the plurality of first light-emitting units 140*a* with each of a plurality of separators 182. Interposed therebetween, and the plurality of third light-emitting units 140*c* are stacked on each of the plurality of third light-emitting units 140*c* with each of a plurality of separators 184 interposed therebetween. The first light-emitting unit 140*a* and the second light-emitting unit 140*b* are electronically insulated from each other by the separator 182, and the second light-emitting unit 140*b* and the third light-emitting unit 140*c* are electronically insulated from each other by the separator 184. Therefore, as is the case with the example shown in FIG. 1, the controlling circuit 300 can allow the plurality of first light-emitting units 140*a* to emit light at the first timing, the plurality of second light-emitting units 140*b* to emit light at the second timing, and the plurality of third light-emitting units 140*c* to emit light at the third timing.

In a case where light is emitted from the second surface 104 of the substrate 100, each first light-emitting unit 140*a*, each separator 182, each second light-emitting unit 140*b*, and each separator 184 have light-transmitting properties. Therefore, light emitted from each second light-emitting unit 140*b* can be transmitted through the separator 182 and the first light-emitting unit 140*a* and emitted from the second surface 104 of the substrate 100, and light emitted from each third light-emitting unit 140*c* can be transmitted through the separator 184, the second light-emitting unit 140*b*, the separator 182, and the first light-emitting unit 140*a* and emitted from the second surface 104 of the substrate 100.

In a case where light is emitted from the opposite side of the second surface 104 of the substrate 100, the separator 182, the second light-emitting unit 140*b*, the separator 184, and the third light-emitting unit 140*c* have light-transmitting properties. Therefore, light emitted from each first light-emitting unit 140*a* can be transmitted through the separator 182, the second light-emitting unit 140*b*, the separator 184, and the third light-emitting unit 140*c* and emitted from the opposite side of the second surface 104 of the substrate 100, and light emitted from each second light-emitting unit 140*b* can be transmitted through the separator 184 and the third light-emitting unit 140*c* and emitted from the opposite side of the second surface 104 of the substrate 100.

In the example shown in FIG. 14, the plurality of first light-emitting units 140*a* which are separated from each other, the plurality of second light-emitting units 140*b* which are separated from each other, and the plurality of third light-emitting units 140*c* which are separated from each other are aligned along the first surface 102 of the substrate 100. However, in another example, a single first light-emitting unit 140*a*, a single second light-emitting unit 140*b*, and a single third light-emitting unit 140*c* may extend along the first surface 102 of the substrate 100. According to the other example, it is possible to simplify the wiring connected to each light-emitting unit, increase the light emission amount of each light-emitting unit, and simplify the coating process of each light-emitting unit.

Figure 15:
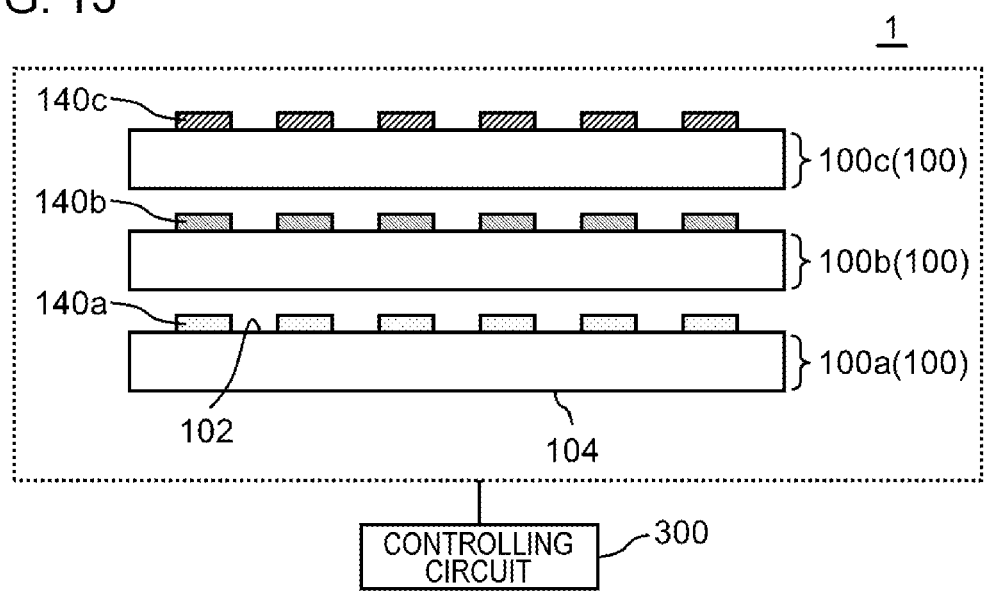
FIG. 15 is a diagram to explain a fourth modification example of a layout of a plurality of first light-emitting units, a plurality of second light-emitting units, and a plurality of third light-emitting units.

FIG. 15 is a diagram to explain a fourth modification example of a layout of the plurality of first light-emitting units 140*a*, the plurality of second light-emitting units 140*b*, and the plurality of third light-emitting units 140*c*.

The light-emitting device 1 includes a plurality of substrates 100, that is, a first substrate 100*a*, a second substrate 100*b*, and a third substrate 100*c*. The second substrate 100*b* is stacked over the first substrate 100*a* and the third substrate 100*c* is stacked over the second substrate 100*b*. The plurality of first light-emitting units 140*a* are located over the first surface 102 of the first substrate 100*a*. The plurality of second light-emitting units 140*b* are located over the first surface 102 of the second substrate 100*b*. The plurality of third light-emitting units 140*c* are located over the first surface 102 of the third substrate 100c. As is the case with the example shown in FIG. 1, the controlling circuit 300 can allow the plurality of first light-emitting units 140a to emit light at the first timing, the plurality of second light-emitting units 140b to emit light at the second timing, and the plurality of third light-emitting units 140c to emit light at the third timing.

In a case where light is emitted from the second surface 104 of the first substrate 100a, the first light-emitting unit 140a and the second light-emitting unit 140b have light-transmitting properties. Therefore, light emitted from each third light-emitting unit 140c can be transmitted through the second light-emitting unit 140b, the second substrate 100b, the first light-emitting unit 140a, and the first substrate 100a and emitted from the second surface 104 of the substrate 100. Light emitted from each second light-emitting unit 140b can be transmitted through the first light-emitting unit 140a and the first substrate 100a and emitted from the second surface 104 of the substrate 100.

In a case where light is emitted from the opposite side (the first surface 102 side of the third substrate 100c) of the second surface 104 of the first substrate 100a, the second light-emitting unit 140b and the third light-emitting unit 140c have light-transmitting properties. Therefore, light emitted from each first light-emitting unit 140a can be transmitted through the second substrate 100b, the second light-emitting unit 140b, the third substrate 100c, and the third light-emitting unit 140c and emitted from the opposite side (the first surface 102 side of the third substrate 100c) of the second surface 104 of the first substrate 100a, and light emitted from each second light-emitting unit 140b can be transmitted through the third substrate 100c and the third light-emitting unit 140c and emitted from the opposite side (the first surface 102 side of the third substrate 100c) of the second surface 104 of the first substrate 100a.

In the example shown in FIG. 15, the plurality of first light-emitting units 140a which are separated from each other, the plurality of second light-emitting units 140b which are separated from each other, and the plurality of third light-emitting units 140c which are separated from each other are aligned along the first surface 102 of the first substrate 100a, the first surface 102 of the second substrate 100b, and the first surface 102 of the third substrate 100c, respectively. However, in another example, a single first light-emitting unit 140a, a single second light-emitting unit 140b, and a single third light-emitting unit 140c may extend along the first surface 102 of the first substrate 100a, the first surface 102 of the second substrate 100b, and the first surface 102 of the third substrate 100c, respectively. According to the other example, it is possible to simplify the wiring connected to each light-emitting unit, increase the light emission amount of each light-emitting unit, and simplify the coating process of each light-emitting unit.

EXAMPLES

Example 1

Figure 16:
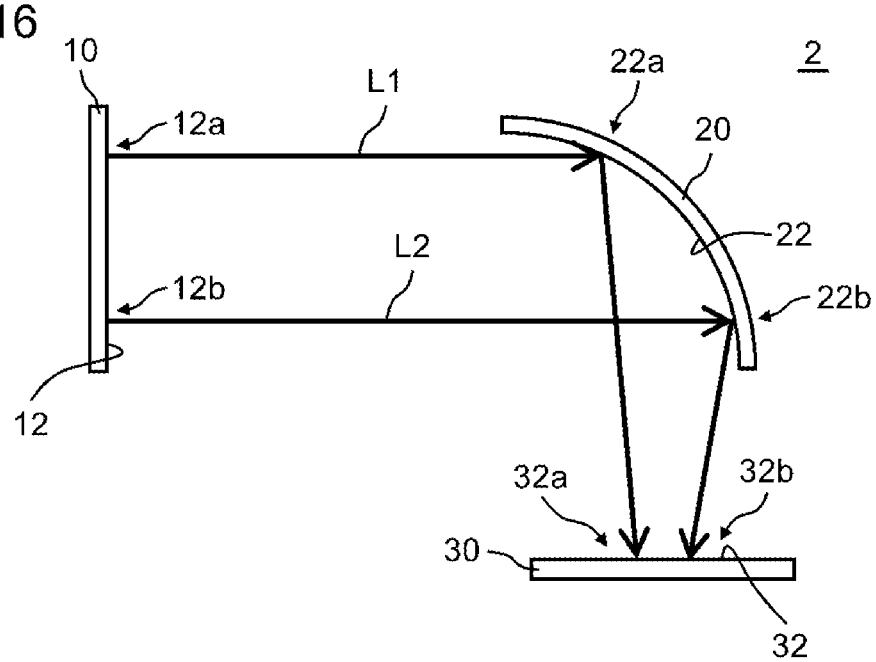
FIG. 16 is a diagram of a light-emitting module according to Example 1.

FIG. 16 is a diagram of a light-emitting module 2 according to Example 1.

The light-emitting module 2 is described using FIG. 16. The light-emitting module 2 includes a light-emitting plate 10 and a reflecting member 20. The light-emitting plate 10 includes a light-irradiating surface 12. The reflecting member 20 includes a reflecting surface 22. The reflecting surface 22 reflects light emitted from the light-irradiating surface 12 of the light-emitting plate 10 toward a target surface 32 of an object 30. Light (light L1) at peak luminous intensity in a light distribution in a first region 12a of the light-irradiating surface 12 is sent to a first region 32a of the target surface 32 via a first region of 22a of the reflecting surface 22. Light (light L2) at peak luminous intensity in a light distribution in a second region 12b of the light-irradiating surface 12 is sent to a second region 32b of the target surface 32 via a second region of 22b of the reflecting surface 22. The optical distance from the first region 12a of the light-irradiating surface 12 to the first region 32a of the target surface 32 via the first region 22a of the reflecting surface 22 is greater than the optical distance from the second region 12b of the light-irradiating surface 12 to the second region 32b of the target surface 32 via the second region 22b of the reflecting surface 22. The luminous intensity of the light L1 is higher than that of light L2.

According to the configuration described above, it is possible to inhibit variation in the brightness distribution of the target surface 32. Specifically, according to the configuration described above, the optical distance of the light L1 is greater than the optical distance of the light L2. Assuming that the luminous intensity of the light L1 is equal to that of the light L2, the attenuation of the light L1 in the optical path of the light L1 may become higher than the attenuation of the light L2 in the optical path of the light L2, and the luminance in the first region 32a of the target surface 32 may become smaller than the luminance in the second region of 32b of the target surface 32. In contrast, according to the configuration described above, the luminance of the light L1 is higher than that of the light L2. Specifically, the luminance of the light L1 is higher than the luminance of the light L2 so that the luminance in the first region 32a of the target surface 32 becomes substantially equal to the luminance in the second region 32b of the target surface 32. In this way, it is possible to inhibit variation in the brightness distribution of the target surface 32. In addition, it is possible to improve the arrangement of the reflecting member 20 and the object 30 and the degree of freedom in terms of design of the shape of the reflecting member 20.

In the example shown in FIG. 16, the light L1 is emitted along the normal direction of the first region 12a of the light-irradiating surface 12, and the light L2 is emitted along the normal direction of the second region 12b of the light-irradiating surface 12. In another example, the light L1, that is, light at peak luminous intensity in the light distribution of the first region 12a of the light-irradiating surface 12, may be emitted along a direction inclined from the normal direction of the first region 12a of the light-irradiating surface 12. In one example, it is possible to adjust the orientation of the peak luminous intensity in a light distribution by adjusting the thickness of each layer of the organic layer 120 (FIG. 2 or FIG. 3) included in the light-emitting plate 10. The same also applies to the light L2.

In the example shown in FIG. 16, the light L1 is emitted substantially in parallel to the light L2. Specifically, the light-irradiating surface 12 of the light-emitting plate 10 is substantially flat. In the example shown in FIG. 16, the luminous intensity distribution of the light-irradiating surface 12 is adjusted to inhibit variation in the brightness distribution of the target surface 32. That is, it is possible to inhibit variation in the brightness distribution of the target surface 32 without curving the light-emitting plate 10.

In the example shown in FIG. 16, the target surface 32 of the object 30 is substantially flat.

Next, a first example of the usage of the light-emitting module 2 is explained. In the example, the light-emitting module 2 can be used for a reflective LCD, more specifically, for example, an electronic view finder (EVF).

In the example, the reflecting member 20 is a polarizing beam splitter (PBS), and the object 30 is a reflective LCD element, more specifically, liquid crystal on silicon (LCOS).

The light-emitting module 2 displays a desired image as follows. S polarization of light irradiated from the light-irradiating surface 12 of the light-emitting plate 10 is reflected toward the object 30 by the reflecting member 20. One region of the target surface 32 of the object 30 returns the S polarization toward the reflecting member 20 without changing the polarization direction of the S polarization reflected from the reflecting member 20. Another one region of the target surface 32 of the object 30 converts the S polarization reflected from the reflecting member 20 to P polarization and returns the P polarization toward the reflecting member 20. The S polarization returned toward the reflecting member 20 does not pass through the reflecting member 20 while the P polarization returned toward the reflecting member 20 passes through the reflecting member 20. The desired image can be displayed by controlling the above-mentioned one region and the other one region of the object 30 by a circuit inside the object 30.

In the example, as explained using the embodiment, it is possible to allow the light-emitting plate 10 to function as a light source of an FSC display. In one example, as is the case with the embodiment, the light-emitting plate 10 emits light of a first color (for example, red (R)) at a first timing, emits light of a second color (for example, green (G)) at a second timing, and emits light of a third color (for example, blue (B)) at a third timing. The object 30 (for example, LCOS) selects a portion of the light of the first color irradiated on the target surface 32 and generates a first image at the first timing, selects a portion of the light of the second color irradiated on the target surface 32 and generates a second image at the second timing, and selects a portion of the light of the third color irradiated on the target surface 32 and generates a third image. One color image can be generated by synthesizing the first image, the second image, and the third image.

Then, a second example of the usage of the light-emitting module 2 is explained. In the example, the light-emitting module 2 can be used for a head-up display (HUD). The HUD can be mounted on, for example, an automobile.

In this example, the reflecting member 20 is a mirror and the object 30 is a transparent display to project an image, and in a case where the HUD is mounted on an automobile, the object 30 may be, for example, a windshield.

Figure 17:
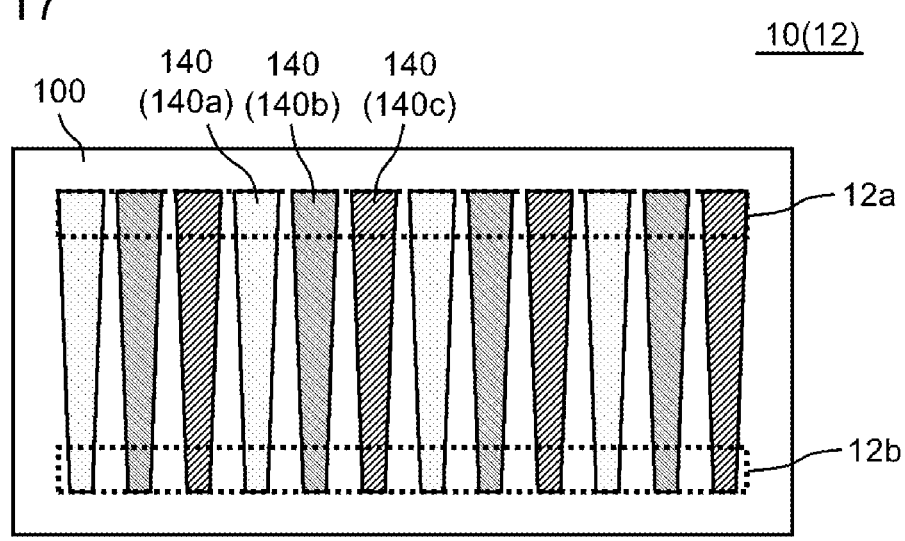
FIG. 17 is a diagram of one example of a layout of a light-irradiating surface of a light-emitting plate shown in FIG. 16.

FIG. 17 is a diagram showing an example of a layout of the light-irradiating surface 12 of the light-emitting plate 10 shown in FIG. 16.

As is the case with the embodiment, the light-emitting plate 10 includes a plurality of light-emitting units 140 (a plurality of first light-emitting units 140a, a plurality of second light-emitting units 140b, and a plurality of third light-emitting units 140c). The plurality of first light-emitting units 140a, the plurality of second light-emitting units 140b, and the plurality of third light-emitting units 140c are repeatedly aligned together.

The area of the first region 12a of the light-irradiating surface 12 is equal to the area of the second region 12b of the light-irradiating surface 12. The area of the light-emitting units 140 occupying the first region 12a is greater than the area of the light-emitting units 140 occupying the second region 12b. Therefore, it is possible to allow the luminous intensity of the light L1 (light irradiated from the first region 12a (FIG. 16)) to be higher than the luminous intensity of the light L2 (light irradiated from the second region 12b (FIG. 17)).

In the example shown in FIG. 17, the width of each light-emitting unit 140 becomes narrower from the first region 12a toward the second region 12b. Therefore, the light-irradiating surface 12 has a luminous intensity distribution in which the luminous intensity decreases from the first region 12a toward the second region 12b.

Example 2

Figure 18:
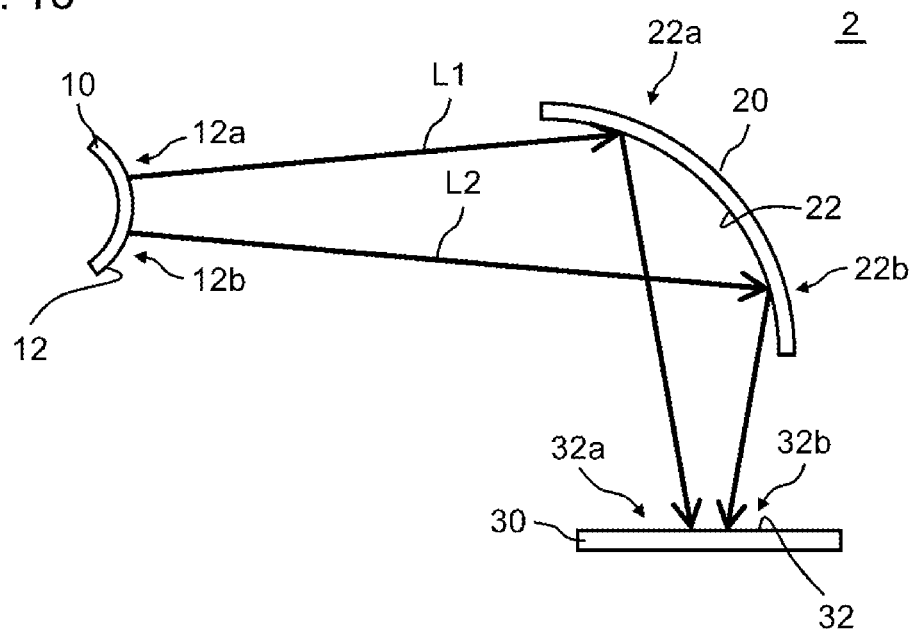
FIG. 18 is a diagram of a light-emitting module according to Example 2.

FIG. 18 is a diagram showing a light-emitting module 2 according to Example 2. The light-emitting module 2 according to Example 2 is the same as the light-emitting module 2 according to Example 1 except the following.

The luminous intensity of the light L1 is substantially equal to the luminous intensity of the light L2. The normal direction in the first region 22a of the reflecting surface 22 is different from the normal direction in the second region 22b of the reflecting surface 22. The optical distance from the first region 12a of the light-irradiating surface 12 to the first region 32a of the target surface 32 via the first region 22a of the reflecting surface 22 is substantially equal to the optical distance from the second region 12b of the light-irradiating surface 12 to the second region 32b of the target surface 32 via the second region 22b of the reflecting surface 22. In the example shown in FIG. 18, the physical distance from the first region 12a of the light-irradiating surface 12 to the first region 32a of the target surface 32 via the first region 22a of the reflecting surface 22 is substantially equal to the physical distance from the second region 12b of the light-irradiating surface 12 to the second region 32b of the target surface 32 via the second region 22b of the reflecting surface 22 in order to make the optical distance of the light L1 substantially equal to the optical distance of the light L2.

According to the configuration described above, it is possible to inhibit variation in the brightness distribution of the target surface 32, Specifically, according to the configuration described above, the normal direction in the first region 22a of the reflecting surface 22 is different from the normal direction in the second region 22b of the reflecting surface 22, and the luminous intensity of the light L1 is substantially equal to the luminous intensity of the light L2. Assuming that the light L1 and the light L2 are irradiated in parallel to each other, the optical distance of the light L1 becomes different from the optical distance of the light L2, and the luminance in the first region 32a of the target surface 32 may become different from the luminance in the second region of 32b of the target surface 32. In contrast, according to the configuration described above, the optical distance of the light L1 is substantially equal to the optical distance of the light L2. Thus, it is possible to inhibit variation in the brightness distribution of the target surface 32. In addition, it is possible to improve the arrangement of the reflecting member 20 and the object 30 and the degree of freedom in terms of design of the shape of the reflecting member 20.

In the example shown in FIG. 13, the reflecting surface 22 of the reflecting member 20 is curved. Therefore, the normal direction of the reflecting surface 22 of the reflecting member 20 is different depending on the region of the reflecting surface 22. According to the configuration described above, even in a case where the reflecting surface 22 of the reflecting member 20 is curved, it is possible to inhibit variation in the brightness distribution of the target surface 32.

In addition, according to the configuration described above, even in a case where the reflecting surface 22 of the reflecting member 20 is not curved and includes a plurality of flat surfaces having normal directions which are different from each other, it is possible to inhibit variation in the brightness distribution of the target surface 32.

In the example shown in FIG. 18, the light L1 and the light L2 are emitted in different directions in order to allow the physical distance with respect to the light L1 to be equal to the physical distance with respect to the light L2. Specifically, the light L1 is emitted along the normal direction of the first region 12a of the light-irradiating surface 12, the light L2 is emitted along the normal direction of the second region 12b of the light-irradiating surface 12, and the light-irradiating surface 12 is curved.

Example 3

Figure 19:
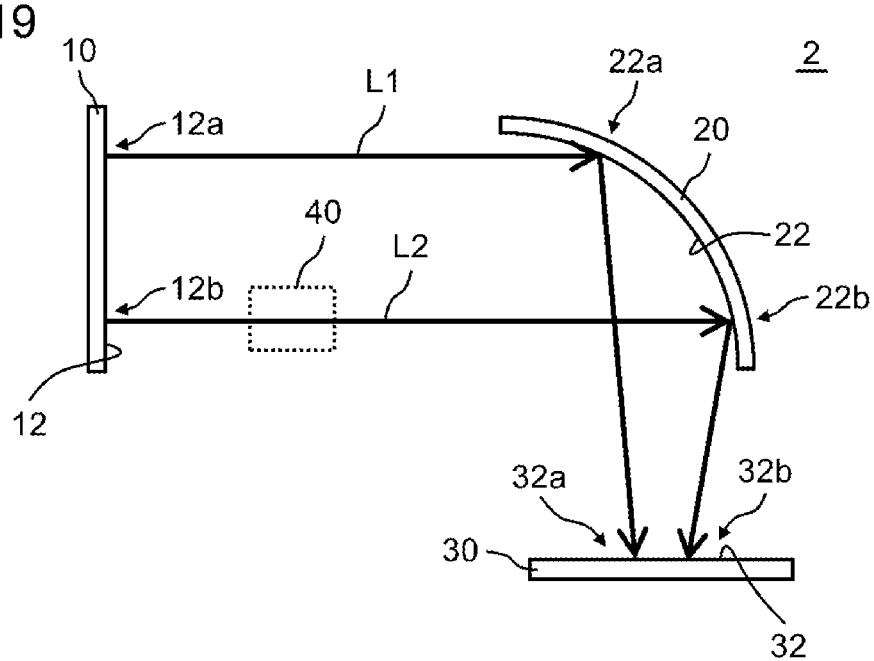
FIG. 19 is a diagram of a light-emitting module according to Example 3.

FIG. 19 is a diagram showing a light-emitting module 2 according to Example 3. The light-emitting module 2 according to Example 3 is the same as the light-emitting module 2 according to Example 2 except the following.

The physical distance from the first region 12a of the light-irradiating surface 12 to the first region 32a of the target surface 32 via the first region 22a of the reflecting surface 22 is greater than the physical distance from the second region 12b of the light-irradiating surface 12 to the second region 32b of the target surface 32 via the second region 22b of the reflecting surface 22. The optical path from the second region 12b of the light-irradiating surface 12 to the second region 32b of the target surface 32 via the second region 22b of the reflecting surface 22 includes a first path portion (a portion other than a high refractive index region 40) having a first refractive index and a second path portion (high refractive index region 40) having a second refractive index which is higher than the first refractive index.

According to the configuration described above, by adjusting the length and the refractive index of the second path portion (high refractive index region 40) with respect to the light L2, it is possible to allow the optical distance of the light L1 to be substantially equal to the optical distance of the light L2. Therefore, it is possible to inhibit variation in the brightness distribution of the target surface 32.

In the example shown in FIG. 19, the first path portion (the portion other than the high refractive index region 40) may be, for example, air, and the second path portion (the high refractive index region 40) maybe, for example, a medium (for example, glass, wafer, or a resin) which has a refractive index higher than that, of air.

In the example shown in FIG. 19, the light L1 is emitted substantially in parallel to the light L2. Specifically, the light-irradiating surface 12 of the light-emitting plate 10 is substantially flat, the light L1 is emitted along the normal direction of the first region 12a of the light-irradiating surface 12, and the light L2 is emitted along the normal direction of the second region 12b of the light-irradiating surface 12. In the example shown in FIG. 19, the high refractive index region 40 is provided to inhibit variation in the brightness distribution of the target surface 32. That is, it is possible to inhibit variation in the brightness distribution of the target surface 32 without curving the light-emitting plate 10.

As described above, although the embodiment and examples of the present invention have been set forth with reference to the accompanying drawings, they are merely illustrative of the present invention, and various configurations other than those stated above can be adopted.

Exemplary reference embodiments will be appended below.

REFERENCE EMBODIMENT 1

In recent years, field sequential color (FSC) displays (for example, FSC liquid crystal displays (LCD)) have been developed as novel displays. The present inventors have considered allowing an OLED to function as a light source of an FSC display.

An example of the problem to be solved by the present invention is to allow an OLED to function as a light source of an FSC display.

1-1. A light-emitting device including:
a plurality of first light-emitting units, each of the plurality of first light-emitting units including an organic EL element emitting light of a first color;
a plurality of second light-emitting units, each of the plurality of second light-emitting units including an organic EL element emitting light of a second color which is different from the first color, each or the plurality of second light-emitting units being adjacent to each of the plurality of first light-emitting units; and
a controlling circuit,
in which the controlling circuit
allows the plurality of first light-emitting units to emit light while inhibiting the plurality of second light-emitting units from emitting light at a first timing, and
allows the plurality of second light-emitting units to emit light while inhibiting the plurality of first light-emitting units from emitting light at a second timing.

1-2. The light-emitting device according to 1-1, further including a substrate having a first surface,
in which the plurality of first light-emitting units and the plurality of second light-emitting units are aligned along the first surface of the substrate.

1-3. The light-emitting device according to 1-2, further including a plurality of third light-emitting units, each of the plurality of third light-emitting units including an organic EL element emitting light of a third color which is different from any of the first color and the second color, the plurality of third light-emitting units aligned together with the plurality of first light-emitting units and the plurality of second light-emitting units along the first surface of the substrate,
in which the controlling circuit
inhibits the plurality of third light-emitting units from emitting light at the first timing and the second timing, and
allows the plurality of third light-emitting units to emit light while inhibiting the plurality or first light-emitting units and the plurality of second light-emitting units from emitting light at a third timing.

1-4. The light-emitting device according to 1-3,
in which the plurality of first light-emitting units, the plurality of second light-emitting units, and the plurality of third light-emitting units are repeatedly aligned along the first surface of the substrate in an order of the first light-emitting unit, the second light-emitting unit, and the third light-emitting unit.

1-5. The light-emitting device according to 1-3 or 1-4,
in which the first color is red,
the second color is green, and
the third color is blue.

1-6. The light-emitting device according to 1-3, further including a plurality of fourth light-emitting units, each of the plurality of fourth light-emitting units including an organic EL element emitting light of a fourth color which is different from any of the first color, the second color, and the third color, the plurality of fourth light-emitting units aligned together with the plurality of first light-emitting units, the plurality of second light-emitting units, and the plurality of third light-emitting units along the first surface of the substrate, in which the controlling circuit inhibits the plurality of fourth light-emitting units from emitting light at the first timing, the second timing, and the third timing, and allows the plurality of fourth light-emitting units to emit light while inhibiting the plurality of first light-emitting units, the plurality of second light-emitting units, and the plurality of third light-emitting units from emitting light at a fourth timing.

1-7. The light-emitting device according to 1-6, in which the plurality of first light-emitting units, the plurality of second light-emitting units, the plurality of third light-emitting units, and the plurality of fourth light-emitting units are repeatedly aligned along the first surface of the substrate in an order of the first light-emitting unit, the second light-emitting unit, the third light-emitting unit, and the fourth light-emitting unit.

1-6. The light-emitting device according to 1-6 or 1-7, in which the first color is red, the second color is green, the third color is blue, and the fourth color is yellow.

1-9. The light-emitting device according to any one of 1-1 to 1-8, further including:

a plurality of first interconnects, each of the plurality of first interconnects connected to each of the plurality of first light-emitting units;

a first wiring connected to the plurality of first interconnects;

a first terminal connected to the first wiring;

a plurality of second interconnects, each of the plurality of second interconnects connected to each of the plurality of second light-emitting units;

a second wiring connected to the plurality of second interconnects; and a second terminal connected to the second wiring, in which the controlling circuit applies voltage, to the first, terminal at the first, timing, to allow the plurality of first light-emitting units to emit light, and applies voltage, to the second terminal at the second timing, to allow the plurality of second light-emitting units to emit light.

1-10. The light-emitting device according to any one of 1-1 to 1-9, in which each of the plurality of first light-emitting units includes each of a plurality of first electrodes which are separated front each other, in which each of the plurality of second light-emitting units includes each of a plurality of first electrodes which are separated from each other, and in which the plurality of first light-emitting units and the plurality of second light-emitting units include a common second electrode which covers the plurality of first electrodes of the plurality of first light-emitting units and the plurality of first electrodes of the plurality of second light-emitting units.

1-11. The light-emitting device according to 1-1, in which each of the plurality of the second light-emitting units is stacked on each of the plurality of first light-emitting units.

1-12. The light-emitting device according to 1-1, further including:

a first substrate on which the plurality of first light-emitting units are located; and a second substrate on which the plurality of second light-emitting units are located, in which the second substrate is stacked over the first substrate.

1-13. A method for controlling a light-emitting device, the method including:

preparing a plurality of first light-emitting units, each of the plurality of first light-emitting units including an organic EL element emitting light of a first color, and a plurality of second light-emitting units, each of the plurality of second light-emitting units including an organic EL element emitting light of a second color which is different from the first color, the plurality of second light-emitting units being adjacent to the plurality of first light-emitting units;

allowing the plurality of first light-emitting units to emit light while inhibiting the plurality of second light-emit ting units from emitting light at a first timing; and allowing the plurality of second light-emitting units to emit light while inhibiting the plurality of first light-emitting units from emitting light at a second timing which is different from the first timing.

REFERENCE EMBODIMENT 2

In an OLED, in order to supply voltage to each of a plurality of interconnects which are connected to each of a plurality of light-emitting units, a common wiring may be connected to the plurality of the interconnects. The present inventors found out that in a case where the common wiring is connected to the plurality of interconnects in an element (for example, a flexible printed circuit (FPC)) located outside a substrate configuring the OLED, the plurality of interconnects need to be arranged at a pitch which is wide to a certain degree in the element depending on the structure of the element.

An example of a problem to be solved by the present invention is to align, at a narrow pitch, each of a plurality of interconnects connected to each of a plurality of light-emitting units.

2-1. A light-emitting device including:

a substrate including a first surface;

a plurality of first light-emitting units located over the first surface of the substrate, each of the plurality of first Light-emitting units including an organic EL element emitting light of a first color;

a plurality of first interconnects located over the first surface of the substrate, each of the plurality of first interconnects connected to each of the plurality of first light-emitting units;

a first wiring located over the first surface of the substrate and connected to the plurality of first interconnects;

a plurality of second light-emitting units located over the first surface of the substrate, each of the plurality of second light-emitting units including an organic EL element emitting light of the first color or a second color;

a plurality of second interconnects located over the first surface of the substrate, each of the plurality of second interconnects connected to each of the plurality of second light-emitting units, and the plurality of second interconnects aligned together with the plurality of first interconnects; and a second wiring located over the first surface of the substrate and connected to the plurality of second interconnects.

2-2. The light-emitting device according to 2-1, further including an insulating layer located over the first surface of the substrate, the insulating layer covering at least a portion of each of the plurality of first interconnects and at least a portion of each of the plurality of second interconnects, in which the first wiring is located over the insulating layer and is overlapped with one region of the first interconnect;

in which the second wiring is located over the insulating layer and is overlapped with one region of the first interconnect and one region of the second interconnect, in which the insulting layer includes an opening to reciprocally connect the first wiring to the first interconnect in the overlapped region of the first wiring and the first interconnect, includes an opening to reciprocally connect the second wiring to the second interconnect in the overlapped region of the second wiring to the second interconnect, and separates the second wiring from the first interconnect from each other in the overlapped region of the second wiring and the first interconnect. 2-3. The light-emitting device according to 2-1 or 2-2, further including:

a plurality of third light-emitting units located over the first surface of the substrate, each of the plurality of third light-emitting units including an organic EL element emitting light of a third color;

a plurality of third interconnects located over the first surface of the substrate, each of the plurality of third interconnects connected to each of the plurality of third light-emitting units, the plurality of third interconnects aligned together with the plurality of first interconnects and the plurality of second interconnects; and a third wiring located over the first surface of the substrate and connected to the plurality of third interconnects.

2-4. The light-emitting device according to 2-3, in which the plurality of first interconnects, the plurality of second interconnects, and the plurality of third interconnects are repeatedly aligned in an order of the first interconnect, the second interconnect, and the third interconnect.

2-5. The light-emitting device according to 2-3 or 2-4, in which the first color is red, the second color is green, and the third color is blue.

2-6. The light-emitting device according to 2-3, further including:

a plurality of fourth light-emitting units located over the first surface of the substrate, each of the plurality of fourth light-emitting units including an organic EL element emitting light of a fourth color;

a plurality of fourth interconnects located over the first surface of the substrate, each of the plurality of fourth interconnects connected to each of the plurality of fourth light-emitting units, the plurality of fourth interconnects aligned together with the plurality of first interconnects, the plurality of second interconnects, and the plurality of third interconnects; and a fourth wiring located over the first surface of the substrate and connected to the plurality of fourth interconnects.

2-7. The light-emitting device according to 2-6, in which the plurality of first, interconnects, the plurality of second interconnects, the plurality of third interconnects, and the plurality of fourth interconnects are repeatedly aligned In an order of the first interconnect, the second interconnect, the third interconnect, and the fourth interconnect.

2-8. The light-emitting device according to 2-6 or 2-7, in which the first color is red, the second color is green, the third color is blue, and the fourth color is yellow.

2-9. The light-emitting device according to any one of 2-1 to 2-8, further including a circuit board including a first terminal, in which the first terminal of the circuit board is connected to the first wiring of the substrate.

This application claims priority from Japanese Patent Application No. 2018-103823, filed May 30, 2018, Japanese Patent Application No. 2018-103829, filed May 30, 2018, and Japanese Patent Application No. 2018-103330, filed May 30, 2018, the disclosures of which are incorporated by reference in their entirety.

The invention claimed is:

1. A light-emitting module comprising:

a light-emitting plate comprising a light-irradiating surface comprising a plurality of striped-pattern light-emitting units; and a reflecting member comprising a reflecting surface to reflect light emitted from the light-irradiating surface of the light-emitting plate toward a target surface of an object, wherein light at a peak luminous intensity in a light distribution in a first region of the light-irradiating surface is sent to a first region of the target surface via a first region of the reflecting surface, wherein light at a peak luminous intensity in a light distribution in a second region of the light-irradiating surface is sent to a second region of the target surface via a second region of the reflecting surface, wherein an optical distance from the first region of the light-irradiating surface to the first region of the target surface via the first region of the reflecting surface is greater than an optical distance from the second region of the light-irradiating surface to the second region of the target surface via the second region of the reflecting surface, and wherein the peak luminous intensity in the light distribution of the first region of the light-irradiating surface is higher than the peak luminous intensity in the light distribution of the second region of the light-irradiating surface.

2. The light-emitting module according to claim 1, wherein the light at the peak luminous intensity in the light distribution of the first region of the light-irradiating surface is emitted substantially in parallel to the light at the peak luminous intensity in the light distribution of the second region of the light-irradiating surface.

3. The light-emitting module according to claim 1, wherein the light at the peak luminous intensity in the light distribution of the first region of the light-irradiating surface is emitted along a normal direction of the first region of the light-irradiating surface, and wherein the light at the peak luminous intensity in the light distribution of the second region of the light-irradiating surface is emitted along a normal direction of the second region of the light-irradiating surface.

4. The light-emitting module according to claim 1,
wherein an area of the first region of the light-irradiating surface is equal to an area of the second region of the light-irradiating surface, and
wherein an area of a light-emitting unit occupying the first region of the light-irradiating surface is greater than an area of a light-emitting unit occupying the second region of the light-irradiating surface.

5. A light-emitting module comprising:
a light-emitting plate comprising a light-irradiating surface; and
a reflecting member comprising a reflecting surface to reflect light emitted from the light-irradiating surface of the light-emitting plate toward a target surface of an object,
wherein light at a peak luminous intensity in a light distribution in a first region of the light-irradiating surface is sent to a first region of the target surface via a first region of the reflecting surface,
wherein light at a peak luminous intensity in a light distribution in a second region of the light-irradiating surface is sent to a second region of the target surface via a second region of the reflecting surface,
wherein the peak luminous intensity in the light distribution of the first region of the light-irradiating surface is substantially equal to the peak luminous intensity in the light distribution of the second region of the light-irradiating surface,
wherein a normal direction in the first region of the reflecting surface is different from a normal direction in the second region of the reflecting surface, and
wherein an optical distance from the first region of the light-irradiating surface to the first region of the target surface via the first region of the reflecting surface is substantially equal to an optical distance from the second region of the light-irradiating surface to the second region of the target surface via the second region of the reflecting surface.

6. The light-emitting module according to claim 5,
wherein a physical distance from the first region of the light-irradiating surface to the first region of the target surface via the first region of the reflecting surface is substantially equal to a physical distance from the second region of the light-irradiating surface to the second region of the target surface via the second region of the reflecting surface.

7. The light-emitting module according to claim 6,
wherein the light at the peak luminous intensity in the light distribution of the first region of the light-irradiating surface is emitted in a direction different from a direction of the light at the peak luminous intensity in the light distribution of the second region of the light-irradiating surface.

8. The light-emitting module according to claim 5,
wherein a physical distance from the first region of the light-irradiating surface to the first region of the target surface via the first region of the reflecting surface is greater than a physical distance from the second region of the light-irradiating surface to the second region of the target surface via the second region of the reflecting surface, and
wherein an optical path from the second region of the light-irradiating surface to the second region of the target surface via the second region of the reflecting surface comprises a first path portion comprising a first refractive index and a second path portion comprising a second refractive index which is higher than the first refractive index.

9. The light-emitting module according to claim 8,
wherein the light at the peak luminous intensity in the light distribution of the first region of the light-irradiating surface is emitted substantially in parallel to the light at the peak luminous intensity in the light distribution of the second region of the light-irradiating surface.

10. The light-emitting module according to claim 5,
wherein the light at the peak luminous intensity in the light distribution of the first region of the light-irradiating surface is emitted along a normal direction of the first region of the light-irradiating surface, and
wherein the light at the peak luminous intensity in the light distribution of the second region of the light-irradiating surface is emitted along a normal direction of the second region of the light irradiating surface.

* * * * *